(12) United States Patent
Dimitrijev et al.

(10) Patent No.: US 8,189,364 B2
(45) Date of Patent: May 29, 2012

(54) CHARGE RETENTION STRUCTURES AND TECHNIQUES FOR IMPLEMENTING CHARGE CONTROLLED RESISTORS IN MEMORY CELLS AND ARRAYS OF MEMORY

(75) Inventors: Sima Dimitrijev, Shailer Park (AU); Herbert Barry Harrison, Caloundra (AU)

(73) Assignee: Qs Semiconductor Australia Pty Ltd., East Melbourne (AU)

( * ) Notice: Subject to any disclaimer, the term of this patent is extended or adjusted under 35 U.S.C. 154(b) by 343 days.

(21) Appl. No.: 12/639,925

(22) Filed: Dec. 16, 2009

(65) Prior Publication Data

US 2010/0149852 A1 Jun. 17, 2010

Related U.S. Application Data

(60) Provisional application No. 61/138,505, filed on Dec. 17, 2008.

(51) Int. Cl.
*G11C 11/00* (2006.01)

(52) U.S. Cl. ........ 365/148; 365/163; 365/105; 365/100; 365/46; 365/176; 365/180; 365/175

(58) Field of Classification Search .................. 365/148, 365/163, 105, 100, 46, 176, 175, 180
See application file for complete search history.

(56) References Cited

U.S. PATENT DOCUMENTS

| 4,404,265 | A | 9/1983 | Manasevit |
| 5,363,800 | A | 11/1994 | Larkin et al. |
| 5,465,249 | A | 11/1995 | Cooper, Jr. et al. |
| 6,212,109 | B1 | 4/2001 | Proebsting |
| 6,282,135 | B1 | 8/2001 | Proebsting |
| 6,306,211 | B1 | 10/2001 | Takahashi et al. |

(Continued)

FOREIGN PATENT DOCUMENTS

WO 2010/091473 A1 8/2010

OTHER PUBLICATIONS

Young, Lee W.; Notification of the Transmittal of the International Search Report and the Written Opinion of the International Searching Authority, or the Declaration,; International Application No. PCT/US2009/68606; Date of Mailing Feb. 19, 2010; Form PCT/ISA/220 (1 page); Form PCT/ISA/210 (2 pages); Form PCT/ISA/237 (5 pages).

(Continued)

*Primary Examiner* — Viet Q Nguyen
(74) *Attorney, Agent, or Firm* — Kokka & Backus, P.C.

(57) ABSTRACT

Embodiments of the invention relate generally to semiconductors and semiconductor fabrication techniques, and more particularly, to devices, integrated circuits, memory cells and arrays, and methods to use silicon carbide structures to retain amounts of charge indicative of a resistive state in, for example, a charge-controlled resistor of a memory cell. In some embodiments, a memory cell comprises a silicon carbide structure including a charge reservoir configured to store an amount of charge carriers constituting a charge cloud. The amount of charge carriers in the charge cloud can represent a data value. Further, the memory cell includes a resistive element in communication with the charge reservoir and is configured to provide a resistance as a function of the amount of charge carriers in the charge reservoir. The charge reservoir is configured to modulate the size of the charge cloud to change the data value.

30 Claims, 14 Drawing Sheets

U.S. PATENT DOCUMENTS

| | | | |
|---|---|---|---|
| 6,429,492 B1* | 8/2002 | Rockett | 257/368 |
| 6,821,340 B2 | 11/2004 | Nagasawa et al. | |
| 6,946,702 B2* | 9/2005 | Jang | 257/306 |
| 6,965,123 B1* | 11/2005 | Forbes et al. | 257/77 |
| 6,974,751 B2* | 12/2005 | Ota | 438/299 |
| 7,362,609 B2* | 4/2008 | Harrison et al. | 365/175 |
| 7,570,521 B2* | 8/2009 | Forbes | 365/185.28 |
| 7,813,158 B2* | 10/2010 | Shuy et al. | 365/148 |
| 7,875,958 B2* | 1/2011 | Cheng et al. | 257/617 |
| 7,944,035 B2* | 5/2011 | Bol | 257/686 |
| 8,030,662 B2* | 10/2011 | Suda | 257/77 |
| 2002/0072249 A1 | 6/2002 | Nagasawa et al. | |
| 2007/0033559 A1 | 2/2007 | Fulkerson | |
| 2008/0038936 A1 | 2/2008 | Todd et al. | |
| 2008/0044932 A1 | 2/2008 | Samoilov et al. | |
| 2008/0079008 A1 | 4/2008 | Yonezawa et al. | |
| 2008/0102204 A1 | 5/2008 | Elers | |
| 2008/0239791 A1 | 10/2008 | Tran | |
| 2009/0014756 A1 | 1/2009 | Singh et al. | |
| 2009/0225582 A1* | 9/2009 | Schloss | 365/148 |
| 2010/0041243 A1 | 2/2010 | Cheng et al. | |
| 2011/0042685 A1* | 2/2011 | Wang et al. | 257/77 |

OTHER PUBLICATIONS

Copenheaver, Blaine R., Notification of Transmittal of the International Search Report and the Written Opinion of the International Searching Authority, or the Declaration, International Application No. PCT/US2010/045949, Date of Mailing Dec. 13, 2010, Form PCT/ISA/220 (2 pages), Form PCT/ISA/210 (4 pages), Form PCT/ISA/237 (5 pages), Search Notes (7 pages).

Copenheaver, Blaine R., Notification of Transmittal of the International Search Report and the Written Opinion of the International Searching Authority, or the Declaration, International Application No. PCT/US 10/45950, Date of Mailing Dec. 14, 2010, Form PCT/ISA/220 (2 pages), Form PCT/ISA/210 (4 pages), Form PCT/ISA/237 (5 pages), Search Notes (6 pages).

Matsunami, Hiroyuki, Hatayama, Tomoaki, Fuyuki, Takashi, "Hetero-interface control and atomic layer epitaxy of SiC," Applied Surface Science, vol. 112 (1997) Elsevier Science B.V., North Holland, Amsterdam, pp. 171-175.

Fuyuki, Takashi, Nakayama, Michiaki, Yoshinobu, Tatsuo, Shiomi, Hiromu, Matsunami, Hiroyuki, "Atomic Layer Epitaxy of Cubic SiC by Gas Source MBE Using Sufrace Superstructure," Journal of Crystal Growth, vol. 95 (1989) North Holland, Amsterdam, pp. 461-463.

Tabe, Michiharu, "Etching of SiO2 Films by Si in Ultra-High Vacuum," Received Oct. 30, 1981, Accepted for Publication Dec. 19, 1981, Japanese Journal of Applied Physics, vol. 21, No. 3 (Mar. 1982) pp. 534-538.

Kugimiya, Koichi, Hirofuji, Yuichi, Matsuo, Naoto, "Si-Beam Radiation Cleaning in Molecular-Beam Epitaxy," Received Sep. 7, 1984, Accepted for Publication Feb. 23, 1985, Japanese Journal of Applied Physics, vol. 24, No. 5 (May 1985) pp. 564-567.

Nagasawa, H. and Yagi, K, "3C-SiC Single-Crystal Films Grown on 6-Inch Si Substrates," phys. stat. sol. (b) (1997).

Brown, A. S.; Joyce, B. A.; Neave, J. H.; Stirland, D. J., "The Epitaxy of Silicon on Quartz," in revised form Feb. 20, 1968, Journal of Applied Crystallography, vol. 1 (1968) pp. 70-82.

Lein, Wei-Cheng, Ferralis, Nicola, Carraro, Carlo, Maboudian, Roya, "Growth of Epitaxial 3C-SiC Films on Si (100) via Low Temperature SiC Buffer Layer," Crystal Growth & Design Communication, vol. 10 (2010) pp. 36-39.

Chen, W.-Y.; Chen, C. C.; Hwang, J., "Growth of 30-SiC on Si(100) by Low Pressure Chemical Vapor Deposition Using a Modified Four-Step Process," Published Apr. 9, 2009, Crystal Growth and Design Communication, vol. 9, No. 6. (2009) pp. 2616-2619.

Jamet, Philippe, Dimitrijev, Sima, Tanner, Philip, "Effects of Nitridation in Gate Oxides Grown on 4H-SiC," School of Microelectronic Engineering, Griffith University, Nathan, Queensland 4111, Australia, 2001.

Wang, Li, Dimitrijev, Sima, Han, Jishen, Zou, Jin, "Deep void formation mechanism in Si(100) during its carbonization reaction with C2H2," Available online Feb. 24, 2007, Science Direct, Thin Solid Films, vol. 515 (2007) pp. 6824-6826.

Wang, Li, Dimitrijev, Sima, Han, Jisheng, Iacopi, Francesca, Zou, Jin, "Transition between amorphous and crystalline phases of SiC deposited on Si substrate using H3SiCH3," Journal of Crystal Growth, vol. 311, Issue 19, Sep. 15, 2009, pp. 4442-4446, Accepted Jul. 28, 2009, Available online Aug. 6, 2009, Accessioned Jun. 25, 2009, Available Jan. 27, 2010.

Han, Jisheng, Dimitrijev, Sima, Kong, Fred, Tanner, Philip, Atanacio, Armand, "SIMS Investigation of Oxygen in 3C-SiC on Si," IEEE Proceedings of the 2008 Conference on Optoelectronics and Microelectronic Materials and Devices (COMMAD), Available online (www.scientific.net) Mar. 2, 2009, Accessioned Mar. 11, 2009, Available May 12, 2009.

Afanas'ev, V. V., Ciobanu, F., Dimitrijev, S., Pensi, G., Stesmans, A., "SiC/SiO2 Interface States: Properties and Models," Materials Science Forum vols. 483-485 (2005) pp. 563-568, Available online (www.scientific.net) May 15, 2005, Accessioned Mar. 17, 2006, Available Mar. 19, 2007.

Soaresa, G. V., Baumvol I. J. R., Hold, L. Kong, F., Han, J., Dimitrijev, S., Radtke, C., Stedile, F. C., "Sequential Thermal Treatments of SiC on NO and O2: Atomic Transport and Electrical Characteristics," Applied Physics Letters 91, 041906 (2007), Accepted Jul. 1, 2007, Published Jul. 26, 2007, Accessioned Feb. 29, 2008, Available Sep. 16, 2009.

Wagner, G., Schmidbauer, M., Irmscher, K., Tanner, P., Fornari, R., "P-Type Doping of Epitaxial 3C-SiC Layers on Silicon (001)," Materials Science Forum vols. 615-617 (2009) pp. 165-168, Available online (www.scientific.net) Mar. 2, 2009, Accessioned Jun. 25, 2009, Available Jan. 27, 2010.

Wang, Li, Dimitrijev, Sima, Hold, Leonie, Kong, Frederick, Tanner, Philip, Han, Jisheng, Wagner, Gunter, "MOS Capacitor Characteristics of 3C-SiC Films Deposited on Si Substrates at 1270C," Materials Research Society Symposia Proceedings, Vo. 1069, Accessioned Mar. 9, 2009, Available Jul. 10, 2009.

Dimitrijev, Sima, "Irreversible Event-Based Model for Thermal Emission of Electrons From Isolated Traps," Journal of Applied Physics, vol. 105, pp. 10376-7-10376-4, Accessioned Jul. 8, 2009, Available Jan. 28, 2010.

Dimitrijev, Sima, Han, Jisheng, Zou, Jin, "Investigation of SiO2-SiC Interface by High-Resolution Transmission Electron Microscope," Materials Science Forum vols. 527-529 (2006) pp. 975-978, Accessioned Mar. 9, 2007, Available online Oct. 16, 2006 (www.scientific.net), Available Sep. 14, 2009.

Kong, Fred C. J., Dimitrijev, Sima, Han, Jisheng, "Electrical Characteristics of Near-Interface Traps in 3C-SiC Metal Oxide Semiconductor Capacitors," IEEE Electron Device Letters, vol. 29, No. 9, pp. 1021-1023, Manuscript, Revised Jun. 11, 2008, Accessioned Mar. 9, 2009, Available May 14, 2009.

Correa, S. A., Radtke, C., Soares, G. V., Miotti, L., Baumvol, I. J. R., Dimitrijev, S., Han, J., Hold, L., Kong, F., Stedile, F. C., "Effects of Nitrogen Incorporation on the Interfacial Layer Between Thermally Grown Dielectric Films and SiC," Applied Physics Letters, vol. 94, pp. 251909-1-251909-3, Accepted Jun. 6, 2009, Accessioned Jul. 8, 2009, Published Jun. 26, 2009, Available Jan. 28, 2010.

Arora, R., Rozen, J., Fleetwood, Daniel M., Galloway, Kenneth F., Zhang, C. Xuan, Han, Jisheng, Dimitrijev, Sima, Kong, Fred, Feldman, Leonard C., Pantelides, Sokrates T., Schrimpf, Ronald D., "Current Mechanisms in n-SiC/p-Si Heterojunctions," Proceedings of the 2008 Conference on Optoelectronic and Microelectronic Materials and Devices (COMMAD '08), Manuscript, Revised Aug. 25, 2009, Accessioned Jun. 25, 2009, Published Dec. 9, 2009, Available Dec. 21, 2009.

Arora, R., Rozen, J., Fleetwood, Daniel M., Galloway, Kenneth F., Zhang, C. Xuan, Han, Jisheng, Dimitrijev, Sima, Kong, Fred, Feldman, Leonard C., Pantelides, Sokrates T., Schrimpf, Ronald D., "Charge Trapping Properties of 3C- and 4H-SiC MOS Capacitors With Nitrided Gate Oxides," Published Dec. 9, 2009, IEEE Transactions on Nuclear Science, vol. 56, No. 6, Dec. 2009, Manuscript, Revised Aug. 25, 2009, Current version published Dec. 9, 2009.

Kong, F., Tanner, P., Hold, L., Han, J., Dimitrijev, S., "Analysis of Surface Generation Mechanisms in MOS Capacitors," IEEE 25th International Conference on Microelectronics, Belgrade, Serbia and Montenegro, May 14-17, 2006, Accessioned Jun. 27, 2007, Available Sep. 16, 2009.

Wang, Li, Dimitrijev, Sima, Tanner, Philip, Zou, Jin, "Aluminum Induced In Situ Crystallization of Amorphous SiC," Applied Physics Letters, vol. 94, pp. 181909-1-181909-3, Accessioned Jul. 8, 2009; Available Jan. 28, 2010.

* cited by examiner

CHARGE RETENTION STRUCTURES AND TECHNIQUES FOR IMPLEMENTING CHARGE CONTROLLED RESISTORS IN MEMORY CELLS AND ARRAYS OF MEMORY

CROSS-REFERENCE TO RELATED APPLICATIONS

This application claims the benefit of U.S. Provisional Application No. 61/138,505, filed Dec. 17, 2008 and entitled "Memory Cell Reading Using a Charge Controlled Resistor," and is related to U.S. Pat. No. 7,362,609, issued Apr. 22, 2008, and entitled "Memory Cell," U.S. Non-provisional application Ser. No. 12/543,473, filed Aug. 18, 2009, entitled "Substrates and Methods of Fabricating Epitaxial Silicon Carbide Structures With Sequential Emphasis," and U.S. Non-provisional application Ser. No. 12/543,478, filed Aug. 18, 2009, entitled "Substrates and Methods of Fabricating Doped Epitaxial Silicon Carbide Structures With Sequential Emphasis," all of which are incorporated herein by reference for all purposes.

FIELD

Embodiments of the invention relate generally to semiconductors and semiconductor fabrication techniques, and more particularly, to devices, integrated circuits, memory cells and arrays, and methods for using silicon carbide structures to retain amounts of charge indicative of a resistive state in, for example, a charge-controlled resistor of a memory cell.

BACKGROUND

A variety of conventional memory cells structures have been developed in various memory technologies. Silicon carbide has been identified recently as a material that can be used in structures that can retain data in a non-volatile manner. While silicon carbide and methods of implementing the same have been used in conventional semiconductor devices, such as in light emitting devices ("LEDs") devices and high power switching devices, the traditional techniques and structures of using silicon carbide may not be well-suited for non-volatile memory devices that implement memory cells based on silicon carbide material. So while conventional memory array and memory cell structures are functional, they may not be well-suited to create memory arrays and cells based on silicon carbide material.

It is desirable to provide improved techniques, systems, integrated circuits, and methods that minimize one or more of the drawbacks associated with devices, integrated circuits, substrates, and methods of retaining data in memory cells and array structures using conventional techniques.

BRIEF DESCRIPTION OF THE FIGURES

The various embodiments of the invention are more fully appreciated in connection with the following detailed description taken in conjunction with the accompanying drawings, in which.

Like reference numerals refer to corresponding parts throughout the several views of the drawings. Note that most of the reference numerals include one or two left-most digits that generally identify the figure that first introduces that reference number.

DETAILED DESCRIPTION

Various embodiments or examples of the invention may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description.

Figure 1:
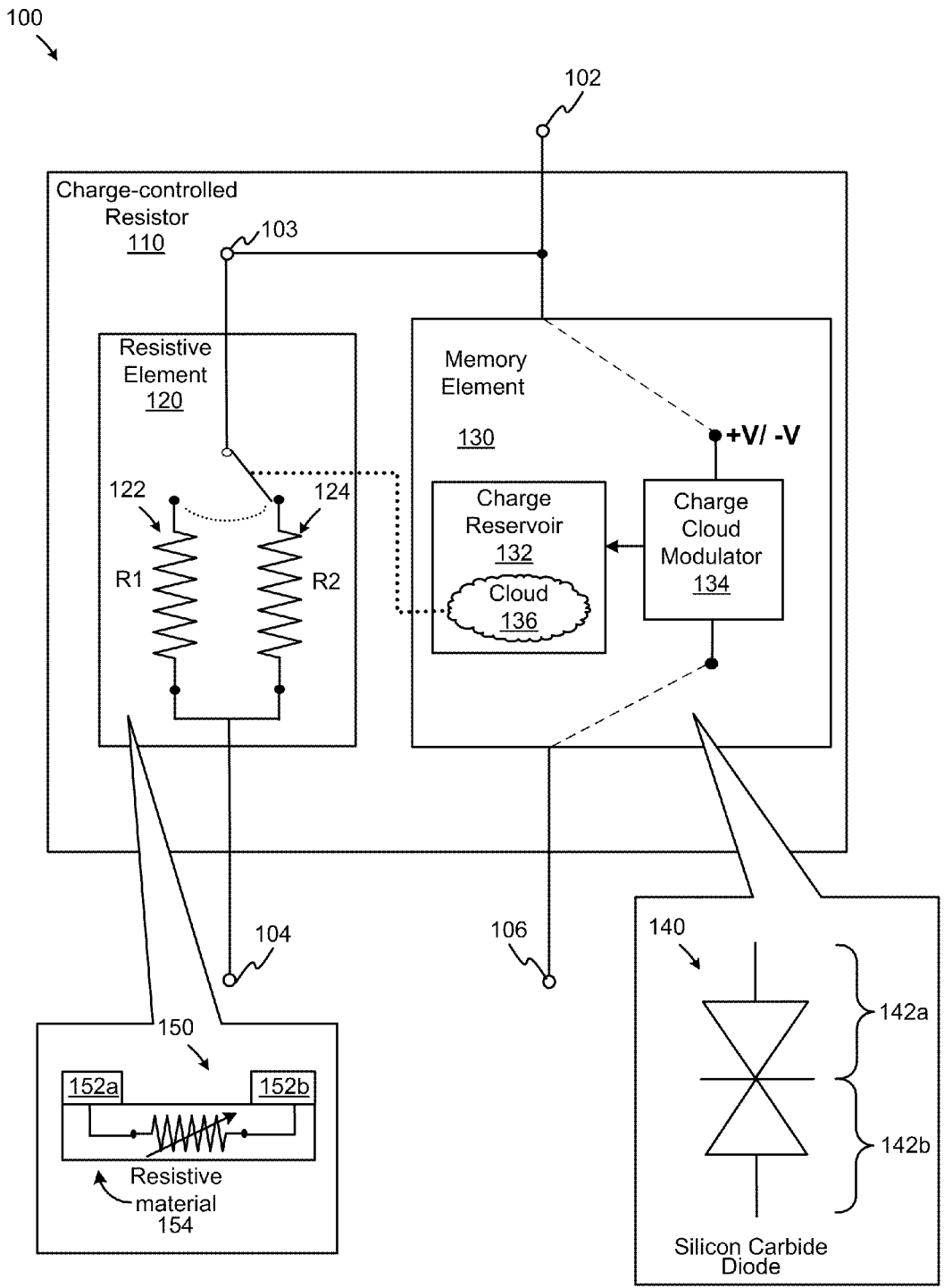
FIG. 1 is a diagram depicting an example of a charge-controlled resistor with a silicon carbide-based memory element, according to various embodiments of the invention.

FIG. 1 is a diagram depicting an example of a charge-controlled resistor with a silicon carbide-based memory element, according to various embodiments of the invention. In the example shown in diagram 100, a charge-controlled resistor 110 includes a resistive element 120 and a memory element 130 composed of silicon carbide, and has three terminals: a terminal 102, a terminal 104, and a terminal 106. Note that while FIG. 1 depicts three terminals, the charge-controlled resistor is not limited to three terminals, according to various other embodiments. Memory element 130 is coupled between terminals 102 and 106 and includes a charge reservoir 132 and a charge cloud modulator 134. Charge reservoir 132 is a portion of a silicon carbide structure configured to store an amount of charge carriers (i.e., mobile charge carriers) in the form of a charge cloud ("cloud") 136. Charge cloud modulator 134 is configured to modulate the size of the charge cloud 136 to, for example, change the amount of charge carriers in charge cloud 136. In various embodiments, charge cloud 136 represents a memory state and the size of charge cloud 136 can be representative of a data value stored in memory element 130. The term "size" can refer to a spatial volume of charge carriers, a density of charge carriers in charge reservoir 132, an amount of charge carriers, and the like, according to various embodiments. Resistive element 120 is coupled to memory element 130 and is configured to provide a resistance as function of the amount of charge carriers in charge cloud 136. To illustrate, consider that resistive element 120 can provide a first resistance ("R1") 122 and a second resistance ("R2") 124 as a function of a first size of charge cloud 136 and a second size of charge cloud 136, respectively. As an example, the first size of charge cloud 136 is greater than the second size, whereby the first size provides for first resistance 122, which is indicative of a first memory state. The second size of charge cloud 136 provides for second resistance 124, which is indicative of a second memory state. In some instances, first resistance 122 is greater than second resistance 124. Thus, multiple resistance states of resistive element 120 can indicate multiple memory states stored in association with charge reservoir 132.

In some embodiments, memory element 130 can be implemented using a silicon carbide diode structure 140, which can be a PN structure, a PNP structure, or an equivalent thereof. In examples that include a PNP structure, diode structure 140 includes a diode 142a and a diode 142b, both of which include silicon carbide. For example, diode 142a can be formed to include a p-type silicon carbide structure and an n-type silicon carbide structure with a P-N junction formed in between, and diode 142b can include the n-type silicon carbide structure common with diode 142a and another p-type silicon carbide structure to form a P-N junction in between. One or more P-N junctions and/or energy barrier heights or widths of diode structure 140 can be configured to provide at least one barrier configured to substantially prevent charge carrier transport in association with charge reservoir 132 to maintain the data value in a first mode of operation. During the first mode of operation, a read voltage level can be applied to terminal 102 and a current indicative of the memory state (i.e., the size of charge cloud 136) stored in memory element 130 can be detected at terminal 104. In some embodiments, the first mode of operation can be an "off" mode of operation whereby the one or more barriers (and barrier heights) are maintained to prevent charge carriers from leaving or entering charge cloud 136.

Charge cloud modulator 134 includes the structures and/or functionalities of at least the barriers and/or P-N junctions, according to some embodiments. Charge cloud modulator 134 is configured to modulate the amount of charge carriers in charge cloud 136 in a second mode of operation. In some embodiments, the second mode of operation can be an "on" mode of operation whereby the one or more barriers are reduced to facilitate transport of charge carriers to enter or leave charge cloud 136. Charge cloud modulator 134 can operate responsive to potential differences applied across terminals 102 and 106. To store a first memory state in memory element 130, a negative voltage programming potential difference is applied across terminals 102 and 106 (e.g., a negative voltage is applied to terminal 102 relative to terminal 106) to add charge carriers for increasing the size of charge cloud 136. By contrast, a positive voltage programming potential difference is applied across terminals 102 and 106 (e.g., a positive voltage is applied to terminal 102 relative to terminal 106) to remove charge carriers for reducing the size of charge cloud 136. Note that while the above-referenced memory element 130 is described as having two memory states, memory element 130 can be configured to store more than two memory states (i.e., memory element 130 can store more than two logical data values), according to at least some embodiments.

In some embodiments, resistive element 120 can be implemented as resistive element 150, which can include resistive material 154 disposed between contacts 152a and 152b. The resistive material 154 can include a homogenous semiconductor material, such as a layer of polysilicon. For example, the homogenous semiconductor material includes the same type of doping, such as n-type doping, and a relatively consistent doping concentration in resistive material 154. As such, a homogenous semiconductor material including a layer of n-type polysilicon excludes doped regions, such as doped source and drain regions, according to at least some embodiments. Contacts 152a and 152b can coincide with terminals 103 and 104, respectively. In the example shown, terminals 102 and 103 are a common terminal. As such, terminal 102 can be configured to couple to a bit line of a memory array (not shown), terminal 106 can be configured to couple to a word line, and terminal 104 can be configured to couple to a source line, according to some embodiments.

Figure 2A:
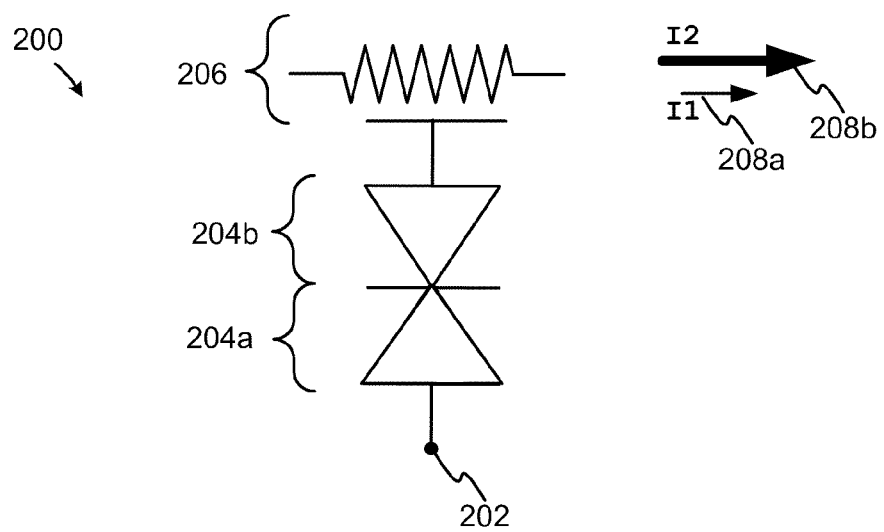
FIG. 2A is a diagram depicting an example of a functional model of a charge-controlled resistor configured to provide read data stored therein, according to at least some embodiments of the invention.

FIG. 2A is a diagram depicting an example of a functional model of a charge-controlled resistor configured to provide read data stored therein, according to at least some embodiments of the invention. Charge-controlled resistor 200 is shown to include a diode device (e.g., a PNP diode) including P-N structures 204a and 204b. Terminal 202 is used to apply either a negative or a positive voltage programming potential difference across P-N structures 204a and 204b to modulate an amount of charge stored in at least one of P-N structures 204a and 204b. The amount of stored charge influences the resistance of resistive element 206. Therefore, charge-controlled resistor 200 can generate a first current ("I1") 208a to indicate a first memory state and a second current ("I2") 208b to indicate a second memory state.

Figure 2B:
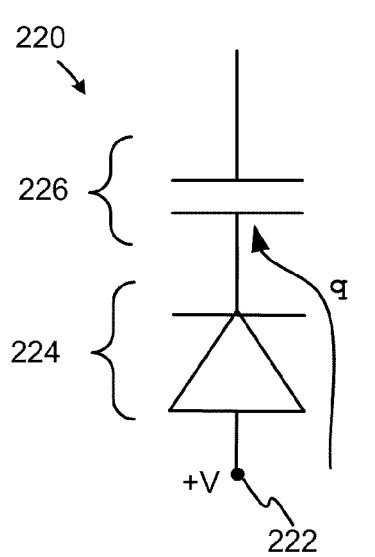
FIGS. 2B and 2C are diagrams depicting examples of functional models to describe the modulation of a charge cloud, according to at least some embodiments of the invention.
Figure 2C:
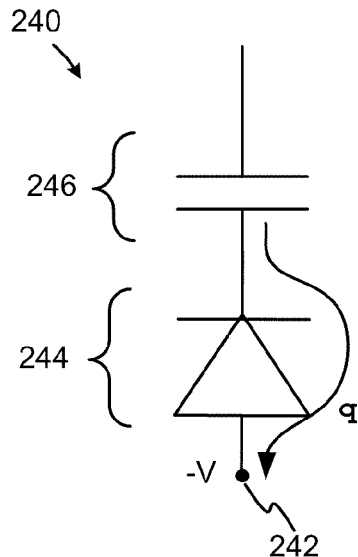

FIGS. 2B and 2C are diagrams depicting examples of functional models to describe the modulation of a charge cloud, according to at least some embodiments of the invention. FIG. 2B illustrates that a charge-controlled resistor (and/or a memory element) can be modeled as functional model 220 during an "on" mode of operation in which charge carriers, q, are added to a charge cloud. As shown, functional model 220 includes a silicon carbide diode 224 having a terminal 222 (e.g., a word line terminal coupled to a word line) at which a first voltage is applied to add charge carriers, q, to capacitor 226 (e.g., a metal-oxide semiconductor, or "MOS" capacitor, or an equivalent thereof). In some cases, capacitor 226 models the functionality of a charge cloud. In FIG. 2B, diode 224 is operating in a "forward on" mode in accordance with some embodiments. FIG. 2C illustrates that the charge-controlled resistor (and/or the memory element) can be modeled as functional model 240 during an "on" mode of operation in which charge carriers, q, are removed from a charge cloud. As shown, functional model 240 includes a silicon carbide diode 244 having a terminal 242 (e.g., a word line terminal coupled to a word line) at which a second voltage is applied to remove charge carriers, q, from capacitor 246. In some cases, capacitor 246 models the functionality of a charge cloud. Note that while in some examples, capacitors 226 and 246 are MOS capacitors and are elements of charge-controlled resistors, capacitors 226 and 246 of models 220 and 240 also can represent the charge storing functionalities of charge-controlled resistors, according to some embodiments. As such, capacitors 226 and 246 can model the functionality of, for example, p-type silicon carbide material operating as a charge reservoir.

Figure 3:
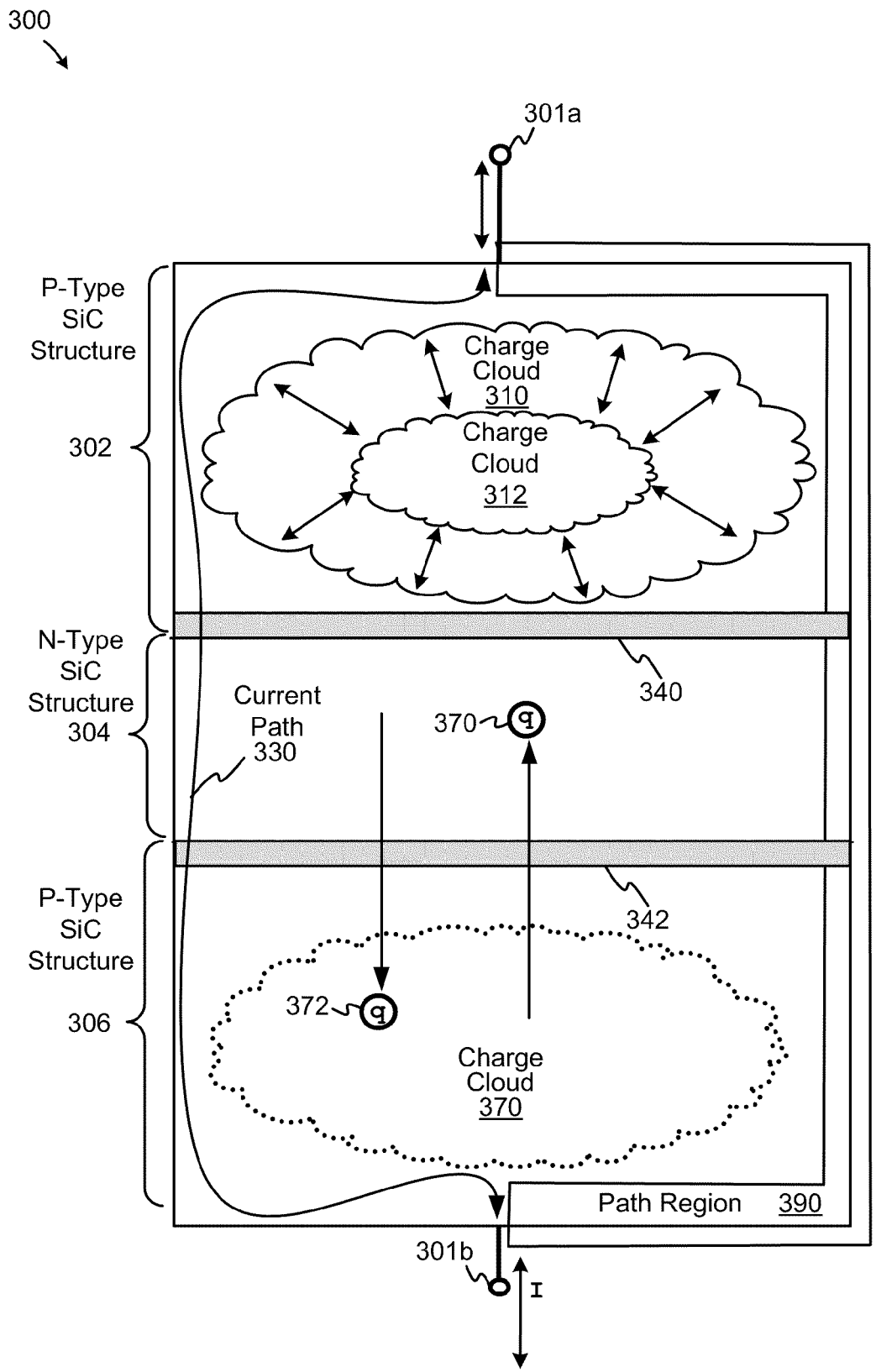
FIG. 3 is a diagram depicting an example of a diode structure as a charge storage portion of a memory element, according to at least some embodiments of the invention.

FIG. 3 is a diagram depicting an example of a diode structure as a charge storage portion of a memory element, according to at least some embodiments of the invention. Diode structure 300 is shown as a PNP diode structure disposed between a terminal 301a and a terminal 301b. The PNP structure includes a p-type silicon carbide structure 306, which can be formed upon a substrate (e.g., a silicon substrate, such as a p-type silicon substrate), according to some embodiments. Further, an n-type silicon carbide structure 304 is formed on top of p-type silicon carbide structure 306, and another p-type silicon carbide structure 302 is formed on top of n-type silicon carbide structure 304. PNP diode structure 300 also includes two P-N junctions 340 and 342 that can facilitate the formation of barriers (e.g., energy barriers) configured to prevent charge carriers from traversing within the diode structure, as well as into or out from the diode structure. A barrier can prevent charge carrier transport either between terminals 301a and 301b or between n-type and p-type silicon carbide structures, according to some embodiments. Further, a barrier can prevent charge carrier transport into or out from diode structure 300, according to some embodiments. Thus, a barrier in PNP diode structure 300 can provide for storage of memory states in association with charge clouds 310 and 312. In some embodiments, one or both of P-N junctions 340 and 342, and/or one or more barriers operate as a charge cloud modulator 134 of FIG. 1.

Charge clouds 310 and 312 can be referred to as "hole clouds" as the charge clouds are formed in PNP diode structure 300. Charge cloud 310 is established by adding holes as charge carriers, q, to p-type silicon carbide structure 302 by placing PNP diode structure 300 in a "forward on" mode of operation. In the "forward on" mode, holes can be added to the storage region by applying a negative voltage to terminal 301a relative to terminal 301b. In some cases, recombination and thermal emission are absent, and, as such, the tunneling of holes out of the storage region can be minimized or eliminated so as not to disturb the memory state. That is, the energy-barrier widths (or heights) can be configured to minimize or avoid tunneling. With negative voltage applied to terminal 301a, the barriers are reduced to enable charge carriers ("q") 370 to traverse P-N junctions 340 and 342 and/or the barriers. Charge carriers 370 can originate, for example, in a p-type silicon substrate (not shown). Once charge cloud 310 accepts as many holes as it can or until PNP diode structure 300 otherwise is transitioned out from "forward on" mode, then PNP diode structure 300 can be place into an "equilibrium" state.

Charge cloud 312 is established by removing holes as charge carriers, q, from p-type silicon carbide structure 302 by placing PNP diode structure 300 in a "reverse on" mode of operation. In the "reverse on" mode, holes can be removed from the storage region by applying a positive voltage to terminal 301a relative to terminal 301b. In some cases, recombination and thermal emission are absent, and, as such, the tunneling of holes into the storage region can be minimized or eliminated so as not to disturb the memory state. For instance, the energy-barrier widths (or heights) can be configured to minimize or avoid tunneling. With positive voltage applied to terminal 301a, the barriers are reduced to enable charge carriers ("q") 372 to traverse P-N junctions 340 and 342 and/or the barriers. Charge carriers 372 can be transported via terminal 301b into, for example, a p-type silicon substrate (not shown). Once charge cloud 312 loses as many holes as it can or until PNP diode structure 300 otherwise is transitioned out from "reverse on" mode, then PNP diode structure 300 is placed into a "non-equilibrium" state. As charge cloud 310 is larger than charge cloud 312, charge cloud 310 has a greater amount of hole carriers than does charge cloud 312.

In some embodiments, p-type silicon carbide structure 302, n-type silicon carbide structure 304, and p-type silicon carbide structure 306 are formed using 3C Silicon Carbide. Note that the n-type and p-type silicon carbide structures need not be limited to 3C SiC, and can implement other types of silicon carbide (e.g., 4H or 6H SiC) in other implementations. P-type silicon carbide structures 302 and 306 can be formed with doping concentrations of p-type carriers between, for example, $10^{15}$ to $10^{19}$ per $cm^3$. In one example, doping concentrations of p-type carriers can be between, for example, $6 \times 10^{16}$ to $2 \times 10^{17}$ per $cm^3$. Further, the thicknesses of p-type silicon carbide structures 302 and 306 can have thicknesses within a range of 20 nm to 600 nm, or greater. N-type silicon carbide structure 304 can be formed with doping concentrations of n-type carriers between, for example, $10^{15}$ to $10^{19}$ per $cm^3$, and can have a thickness within a range of 20 nm to 600 nm, or greater. In some embodiments, p-type silicon carbide structures 302 and 306 and n-type silicon carbide structure 304 can be formed as set forth in one or more of the following: U.S. patent application Ser. No. 12/543,473, filed on Aug. 18, 2009, and titled "Substrates and Methods of Fabricating Epitaxial Silicon Carbide Structures with Sequential Emphasis," and U.S. patent application Ser. No. 12/543,478, filed on Aug. 18, 2009, and title "Substrates and Methods of Fabricating Doped Epitaxial Silicon Carbide Structures with Sequential Emphasis," both of which are hereby incorporated by reference.

In some embodiments, PNP diode structure 300 is formed to provide at least one barrier of about 1.6 eV, or greater, in an "off" mode of operation to reduce the thermal emission to a level that corresponds, for example, to duration of approximately 10 years at 85° C. during which a memory state is retained. The holes in 3C SiC can be separated from the electrons in metals, such as a control gate (e.g., a bit line) and n-type 3C SiC in n-type silicon carbide structure 304 by barriers that are greater than 1.6 eV. Among other things, the p-type and n-type doping concentrations and thicknesses can be established in a manner that minimizes or eliminates hole current by way of tunneling, according to some embodiments. Note that in one embodiment, a current (e.g., a leakage current) can flow along the sides (e.g., internally and/or externally) of PNP diode structure 300 along a current path 330, or any current path in a path region 390. The magnitude of the current is a function of the amount of charge stored in p-type silicon carbide structure 302, and, as such, can be indicative of the memory state. In one embodiment, PNP diode structure 300 can be implemented as a portion of a two-terminal memory cell. While FIG. 3 depicts a PNP diode structure, the various embodiments of the invention are not so limited and can include an NPN diode or equivalent diode structures.

Figure 4A:
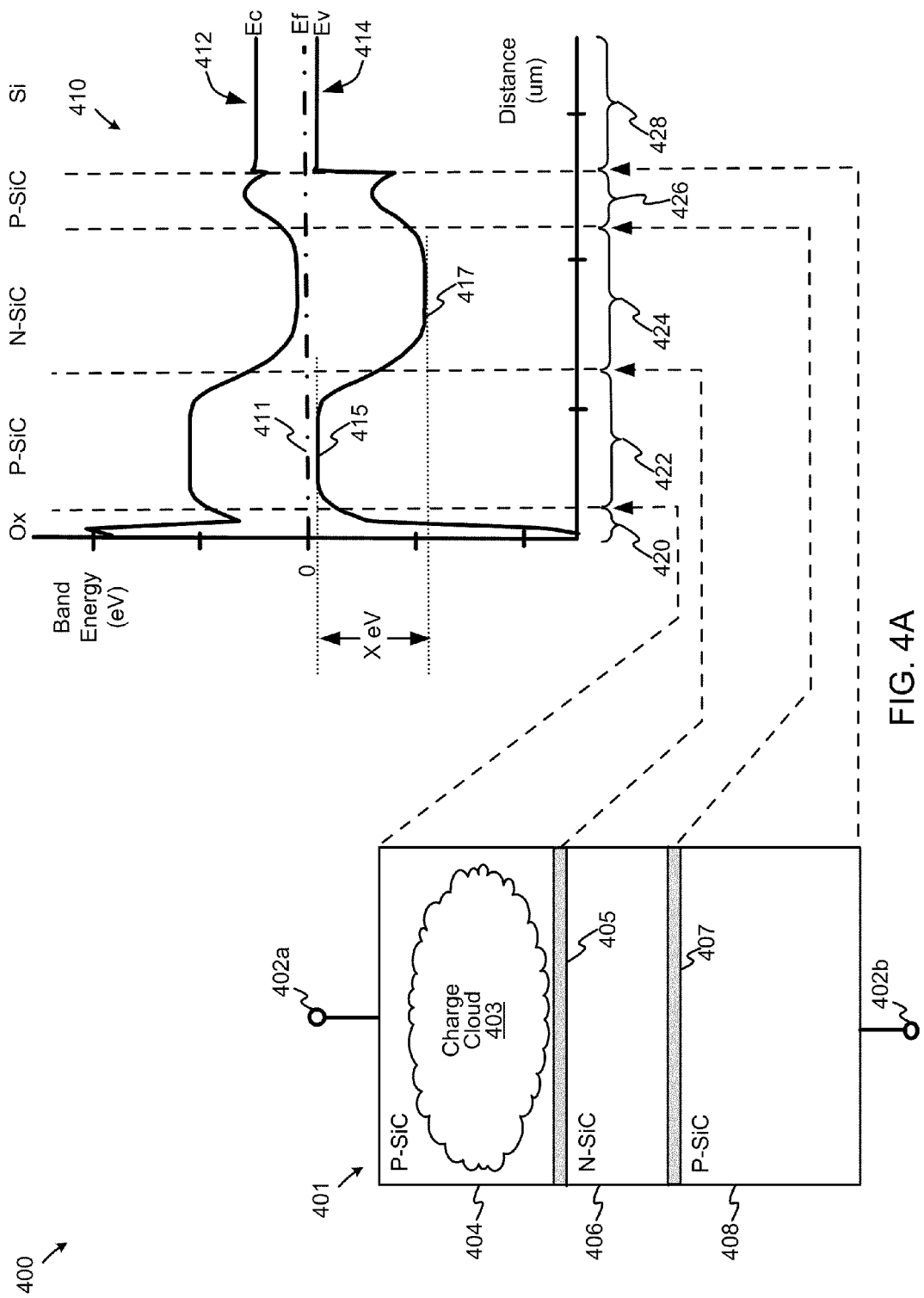
FIGS. 4A to 4C depict the modification of at least one barrier in a diode structure to transition from an equilibrium state to a non-equilibrium state, according to some embodiments of the invention.
Figure 4B:
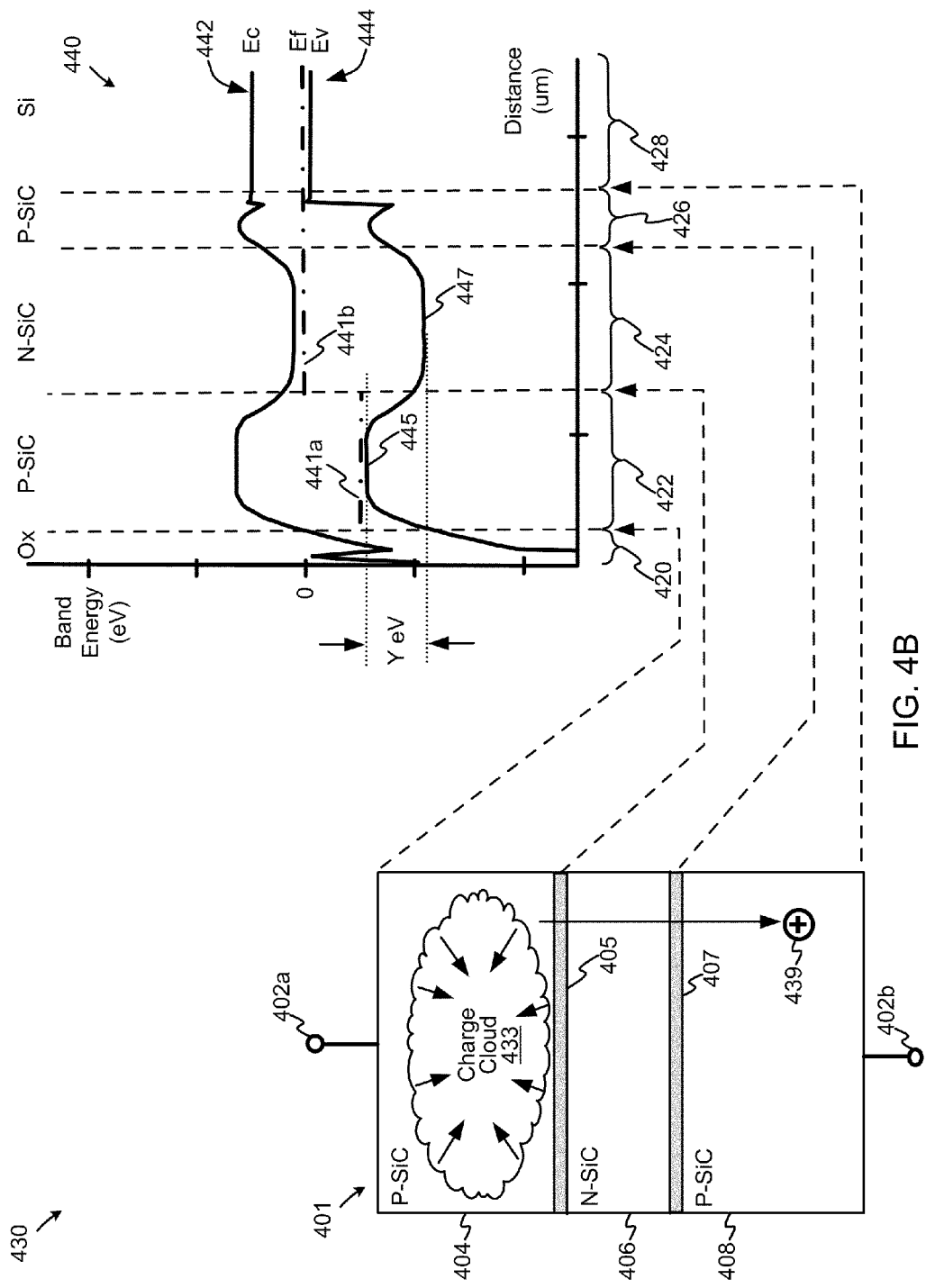
Figure 4C:
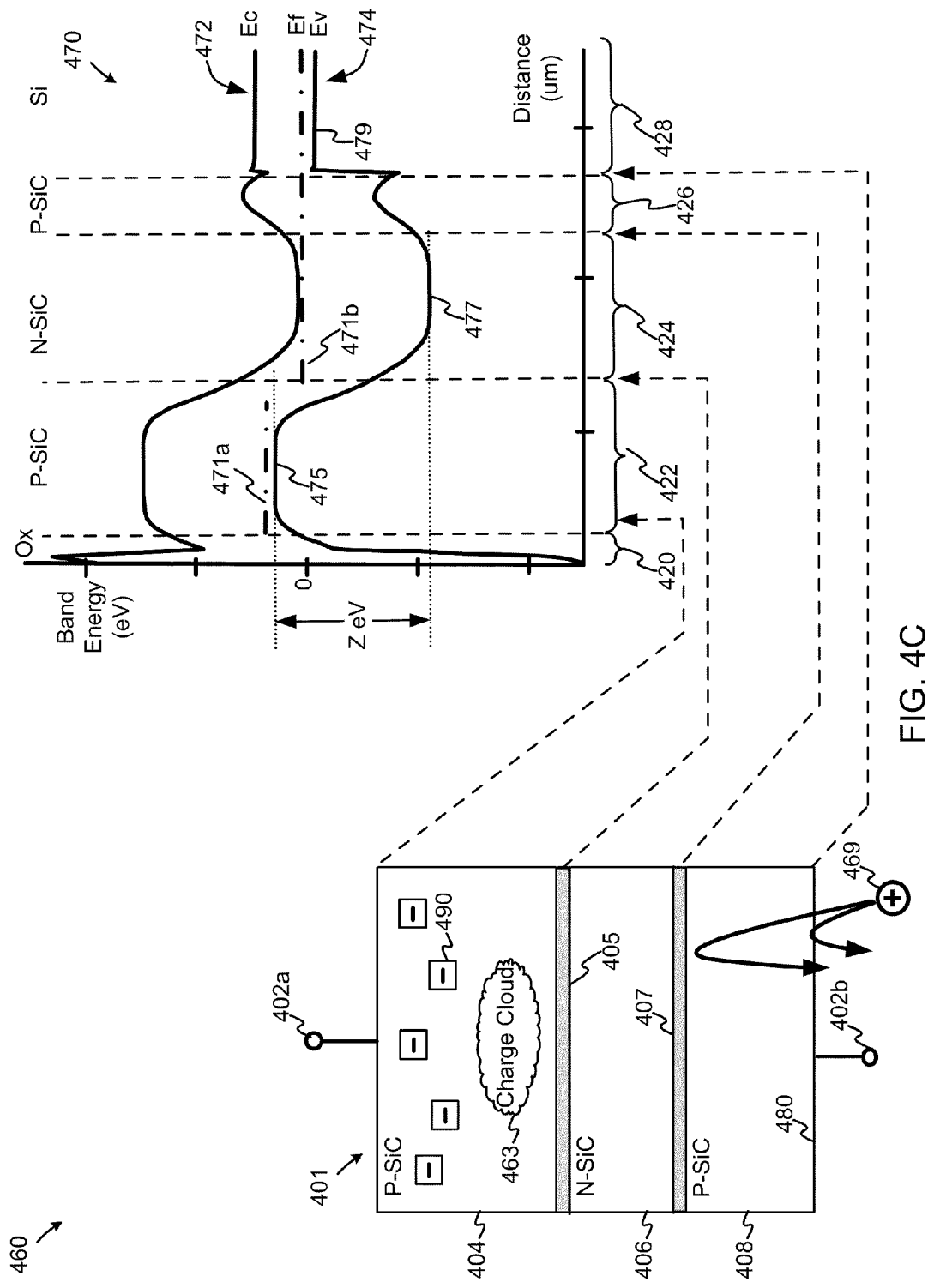

FIGS. 4A to 4C depict the modification of at least one barrier in a diode structure to transition from an equilibrium state to a non-equilibrium state, according to some embodiments of the invention. Note that the band energy diagrams shown in FIGS. 4A to 4C are for discussion purposes to illustrate examples of modifying barriers to prevent charge carrier transport. The band energy diagrams are not intended to be limiting and are illustrative of the operation of a silicon carbide diode; there are many other band energy diagrams for different PNP and NPN silicon carbide diode configurations. In FIG. 4A, diagram 400 shows a PNP diode structure 401 in an equilibrium state and a corresponding band energy diagram 410 for band energies associated with the portions of PNP diode structure 401, according to some embodiments. Band energy diagram 410 shows energies ("Ec") 412 of the conduction levels, Fermi energy levels ("Ef") 411, and energies ("Ev") 414 of the valence levels for the portions of PNP diode structure 401. PNP diode structure 401 is formed between terminals 402a and 402b, and includes a p-type silicon carbide structure ("P-SiC") 408, an n-type silicon carbide structure ("N-SiC") 406, and a p-type silicon carbide structure ("P-SiC") 404. Note that PNP diode structure 401 can be coupled directly or indirectly (e.g., via an oxide or a substrate) to terminals 402a and 402b. Also formed are P-N junctions 405 and 407. Further, p-type silicon carbide structure 404 has a thickness 422, n-type silicon carbide structure 406 has a thickness 424, and p-type silicon carbide structure 408 has a thickness 426. Omitted from FIG. 4A are a gate dielectric or oxide ("Ox") having a thickness of 420 formed upon the top PNP diode structure 401, and a substrate having at least a partial thickness 428. In a specific embodiment, and by way of example only, the substrate can be formed as a p+-type silicon substrate having a p-type doping concentration of $10^{18}$ per cm$^3$, and p-type silicon carbide structure 408 can be formed to have a thickness of 50 nm and a p-type doping concentration of $5 \times 10^{17}$ per cm$^3$, or greater. Further, n-type silicon carbide structure 406 can be formed to have a thickness of 240 nm and an n-type doping concentration from $2 \times 10^{17}$ to $3 \times 10^{17}$ per cm$^3$, and p-type silicon carbide structure 404 can be formed to have a thickness of 200 nm and a p-type doping concentration of $5 \times 10^{17}$ per cm$^3$, or greater.

As shown, at least p-type silicon carbide structure 404 includes a charge cloud 403 having a size indicative of being in an equilibrium state. In some examples, when PNP diode structure 401 is in an equilibrium state, PNP diode structure 401 is considered "programmed." Further to the example shown in FIG. 4A, consider that PNP diode structure 401 is in an "off" mode of operation. As such, at least one energy barrier is formed as the difference, X eV, between a valence energy level 417 (for n-type silicon carbide structure 406) and a valence energy level 415 (for p-type silicon carbide structure 404). As the difference X eV is greater than 1.6 eV, at least one barrier in PNP diode structure 401 is sufficient to retain charge in charge cloud 403 for approximately 10 years at 85 degrees Centigrade, as an example. In one example, X eV is 2.0 eV, which is greater than a barrier height of 1.6 eV. Note that in some embodiments, p-type silicon carbide structure 408 can include another charge cloud 370 that need not modulate as described herein.

FIG. 4B is a diagram 430 showing PNP diode structure 401 transitioning from an equilibrium state to a non-equilibrium state, according to some embodiments. In particular, a negative voltage is being applied to terminal 402a relative to terminal 402b in an "on" mode of operation, which, in turn, reduces the size of charge cloud 433. FIG. 4B also includes a band energy diagram 440 of band energies associated with the portions of PNP diode structure 401 in "on" mode, according to some embodiments. Band energy diagram 440 shows energies ("Ec") 442 of the conduction levels, Fermi energy levels ("Ef") 441a and 441b, and energies ("Ev") 444 of the valence levels for portions of PNP diode structure 401. The negative programming voltage alters the band energies to reduce a barrier height having a barrier difference, Y eV, which corresponds to a difference between a valence energy level 447 for n-type silicon carbide structure 406 and a valence energy level 445 for p-type silicon carbide structure 404. As the difference Y eV is less than 1.6 eV, a barrier in PNP diode structure 401 is reduced sufficiently to remove hole carriers 439 from charge cloud 433. In one example, Y eV is 1.0 eV, which is less than a barrier height of 1.6 eV.

FIG. 4C is a diagram 460 showing PNP diode structure 401 in a non-equilibrium state, according to some embodiments. In particular, the negative voltage that had been previously applied in FIG. 4B is absent at terminal 402a, and PNP diode structure 401 in FIG. 4C is returned to an "off" mode of operation. FIG. 4C also includes a band energy diagram 470 of band energies associated with the portions of PNP diode structure 401 when PNP diode structure 401 is in an "off" mode operation and in a non-equilibrium state. In the non-equilibrium state, or "erased" state, charge cloud 463 has a reduced size, and p-type silicon carbide structure 404 includes a depleted region of negative acceptors 490, which are immobile charge ions (i.e., negatively charged ions). Such immobile charge ions are configured to facilitate generation of an electric field. Band energy diagram 470 shows energies ("Ec") 472 of the conduction levels, Fermi energy levels ("Ef") 471a and 471b, and energies ("Ev") 474 of the valence levels for portions of PNP diode structure 401. At least one energy barrier is formed to have a barrier difference, Z eV, which corresponds to a difference between a valence energy level 477 for n-type silicon carbide structure 406 and a valence energy level 475 for p-type silicon carbide structure 404. As the difference, Z eV, is greater than 1.6 eV, a barrier in PNP diode structure 401 has a sufficient barrier height to retain charge in charge cloud 463 for approximately 10 years at 85 degrees Centigrade, as an example. In one example, Z eV is 2.8 eV, which is greater than a barrier height of 1.6 eV. Further to this example, another difference between valence energy level 477 for n-type silicon carbide structure 406 and a valence energy level 479 for a silicon substrate is greater than 1.6 eV, according to some embodiments. As such, a hole carrier 469 from the silicon substrate may face a barrier at either the P-SiC/Si Substrate interface 480 or at the P-SiC/N-SiC interface 407, or both. Thus, the hole carrier 469 does not traverse to charge cloud 463. In other embodiments, diode structure 401 can transition from the non-equilibrium state in FIG. 4C to the equilibrium state in FIG. 4A in a similar, but reverse manner.

Figure 5:
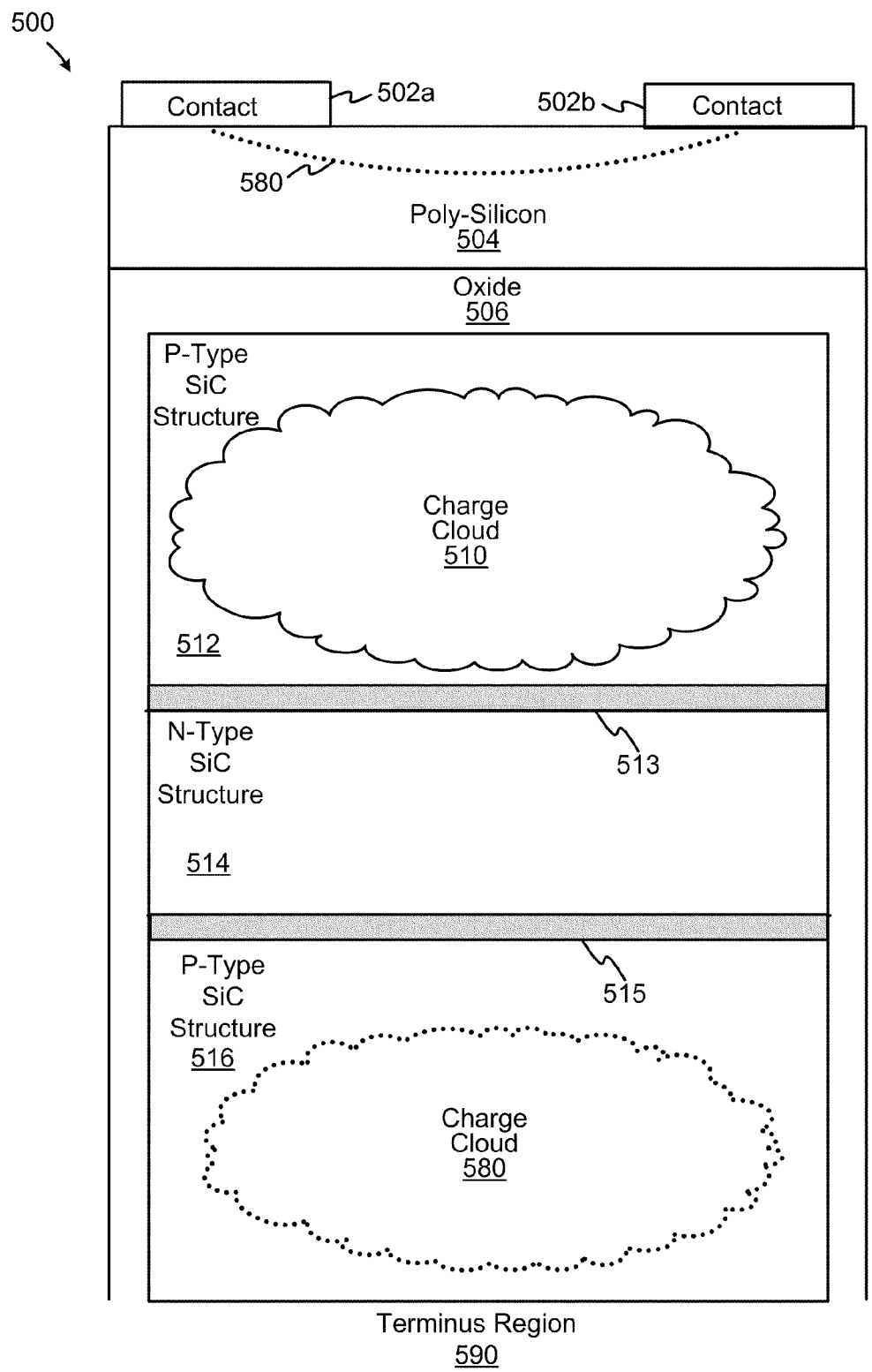
FIG. 5 is a diagram depicting an example of a charge-controlled resistor based on a silicon carbide-based memory element, according to various embodiments of the invention.

FIG. 5 is a diagram depicting an example of a charge-controlled resistor based on a silicon carbide-based memory element, according to various embodiments of the invention. Charge-controlled resistor 500 includes a PNP diode structure formed to include a p-type silicon carbide structure ("P-type SiC") 516 having a charge cloud 580 that need not modulate as described herein, an n-type silicon carbide structure ("N-type SiC") 514, and a p-type silicon carbide structure ("P-type SiC") 512 having a charge cloud 510. Also formed are P-N junctions 513 and 515. Charge-controlled resistor 500 is shown also to reside on a terminus region 590, which can be a semiconductor substrate (e.g., an n-type or p-type silicon substrate, or any other kind of suitable substrate) or any other semiconductor-related surface, including a word line. Further, an oxide 506 is formed on the PNP structure, and, in turn, a polysilicon layer 504 is formed thereon. In some embodiments, oxide 506 operates as a gate dielectric and is formed as a silicon dioxide ($SiO_2$) layer. In at least some embodiments, oxide 506 can be referred to as a charge-controlled resistor ("CCR") gate. Charge cloud 510 is configured to modify the resistance of a conductive path 580 between a first contact 502a (e.g., a bit line) and a second contact 502b (e.g., a source line). In some embodiments, metal contacts 502a and 502b to polysilicon 504 are sufficient, thereby obviating a requirement for doped source and drain regions. As such, doped source and drain regions are optional. A homogeneous polysilicon layer reduces or eliminates an increase in the "off" mode current and variability of the current that might otherwise be caused by lateral diffusion of source and drain dopants in, for example, a structure similar to a Thin Film Transistor ("TFT").

Figure 6A:
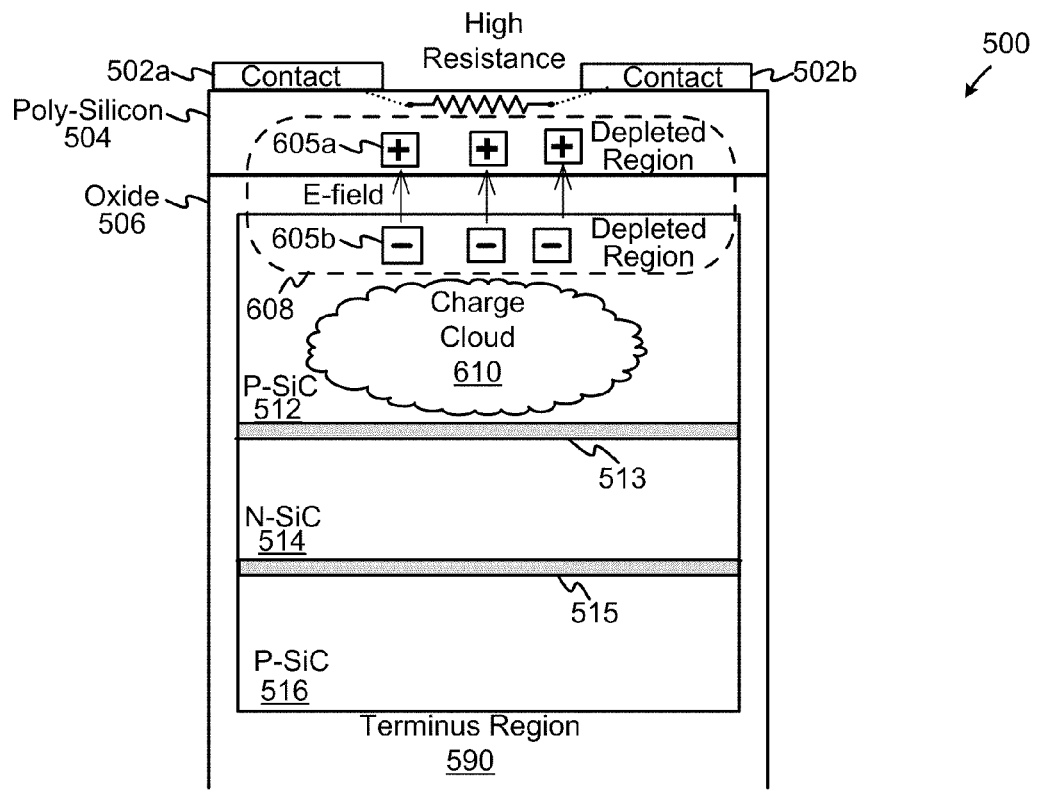
FIGS. 6A and 6B depict examples of the charge-controlled resistor of FIG. 5 in a non-equilibrium state and an equilibrium state, respectively, according to some embodiments of the invention.
Figure 6B:
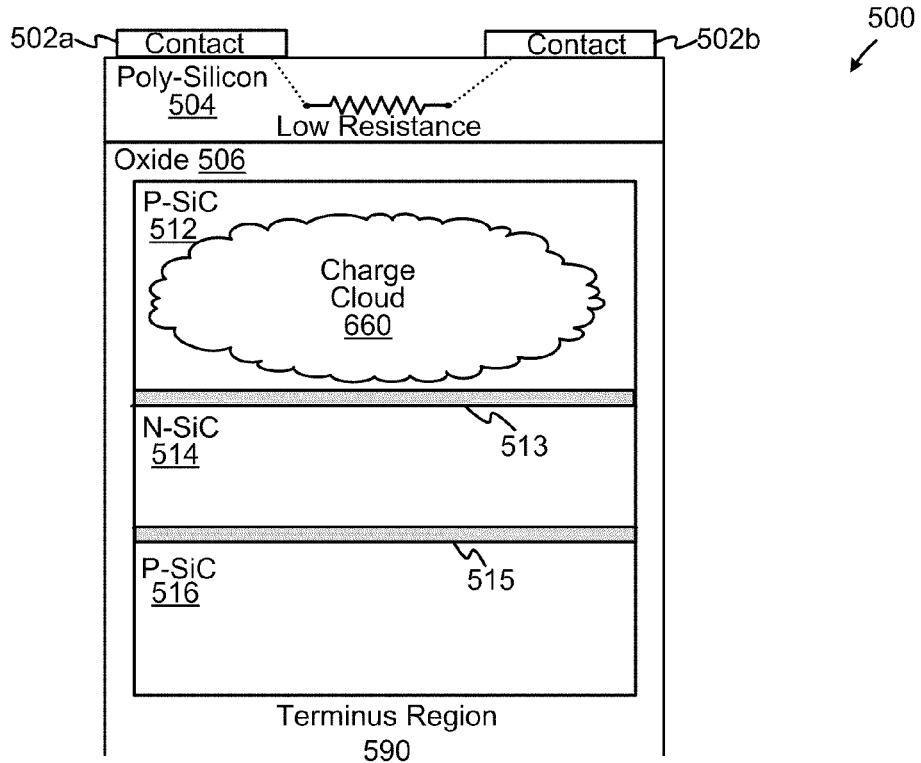

FIGS. 6A and 6B depict examples of the charge-controlled resistor of FIG. 5 in a non-equilibrium state and an equilibrium state, respectively, according to some embodiments of the invention. FIG. 6A depicts charge-controlled resistor 500 being in a non-equilibrium state (e.g., an erased state) in which a charge cloud 610 has a reduced size. The relatively small size of charge cloud 610 gives rise to a depleted region of negative acceptors 605b (e.g., negatively-charged immobile ions) in p-type silicon carbide structure 512. The depleted region of negative acceptors 605b induces an electric field 608 that crosses oxide 506 into a depleted region of positive donors 605a (e.g., positively-charged immobile ions) in poly-silicon 504. By forming electric field 608 with negative acceptors 605b and positive donors 605a disposed on different sides of oxide 506, interface-related issues and leakage through oxide 506 may be minimized or eliminated. The depleted region of positive donors 605a in poly-silicon 504 increases the resistance of the conductive path 580 of FIG. 5, thereby placing charge-controlled resistor 500 in a high resistance state. Thus, poly-silicon 504, as a resistive element, has a relatively high resistance between contacts 502a and 502b responsive to the memory state associated with charge cloud 610. A read voltage applied to contact 502a generates a current at contact 502b indicative of the memory state. In some embodiments, a read voltage is less than the "on" mode voltages, such as the negative and positive programming voltages that reduce the barriers in the PNP diode structure. In at least one embodiment, induced electric field 608 in polysilicon 504 may also deplete mobile charges in grain boundaries, thereby creating a lower current in an "off" mode of operation of charge-controlled resistor 500.

FIG. 6B depicts charge-controlled resistor 500 being in an equilibrium state (e.g., a programmed state) in which a charge cloud 660 has an enhanced size. The relatively large size of charge cloud 660 reduces or eliminates the depleted region of negative acceptors 605b in p-type silicon carbide structure 512, thereby reducing the resistance of the conductive path 580 of FIG. 5. Therefore, charge-controlled resistor 500 of FIG. 6B is in a low resistance state as poly-silicon 504, as a resistive element, has a relatively low resistance between contacts 502a and 502b.

Figure 7A:
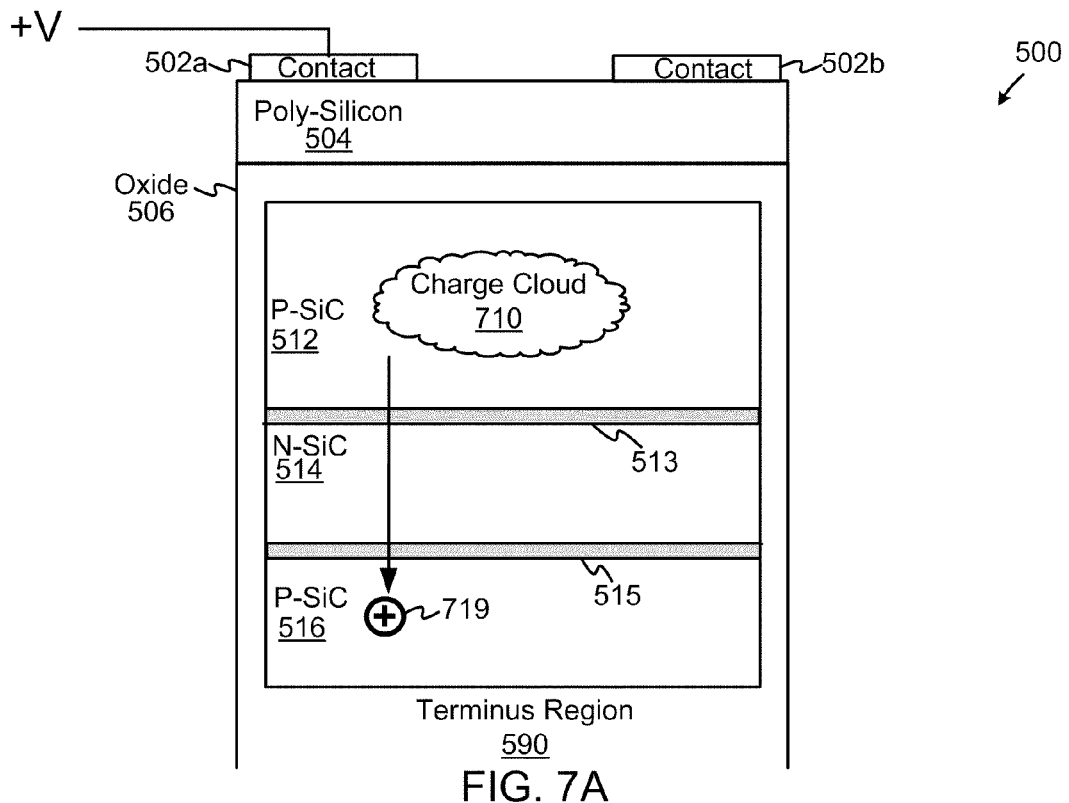
FIGS. 7A and 7B depict examples of the charge-controlled resistor of FIG. 5 transitioning between a non-equilibrium state and an equilibrium state, according to some embodiments of the invention.
Figure 7B:
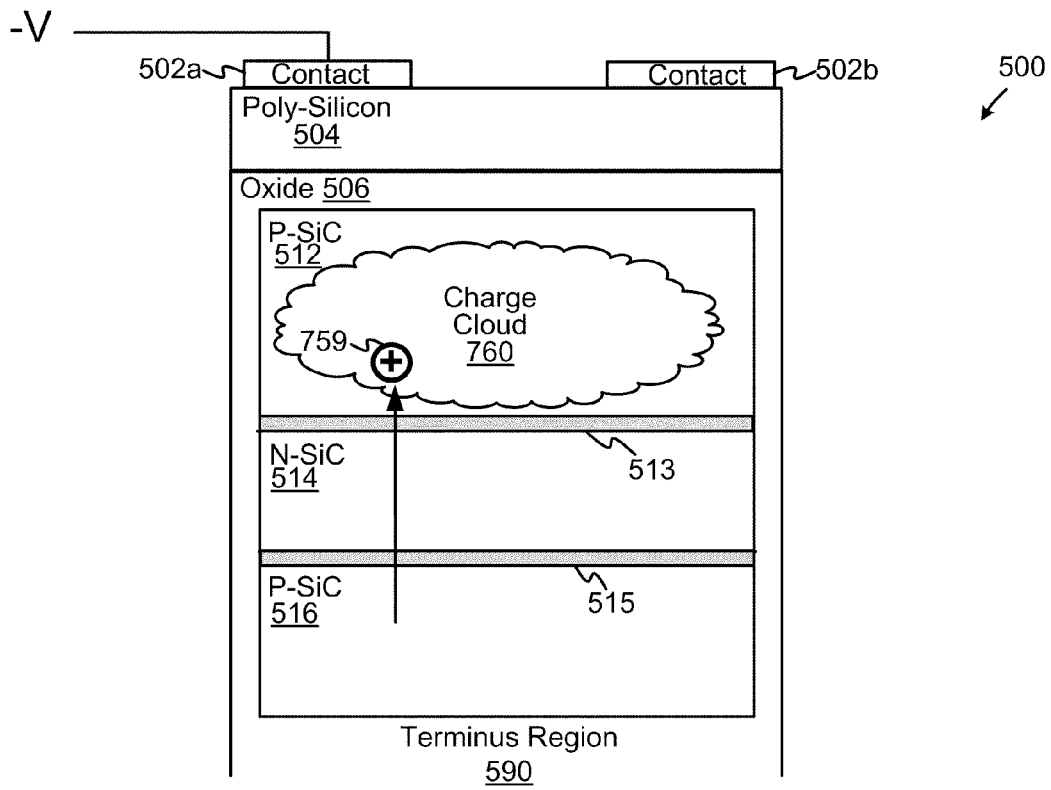

FIGS. 7A and 7B depict examples of the charge-controlled resistor of FIG. 5 transitioning between a non-equilibrium state and an equilibrium state, according to some embodiments of the invention. FIG. 7A depicts charge-controlled resistor 500 being transitioned from an equilibrium state (e.g., a programmed state) to a non-equilibrium state (e.g., an erased state) in "reverse on" mode by applying a positive programming voltage, +V, to contact 502a (e.g., a bit line) relative to terminus region 590 (e.g., a word line) to remove holes 719 from charge cloud 710 until the size is reduced sufficiently to change the memory state. FIG. 7B depicts charge-controlled resistor 500 being transitioned from a non-equilibrium state (e.g., an erased state) to an equilibrium state (e.g., a programmed state) in "forward on" mode by applying a negative programming voltage, −V, to contact 502a relative to terminus region 590 to add holes 759 to charge cloud 760 from, for example, a silicon substrate until the size is enhanced to change the memory state.

Figure 8:
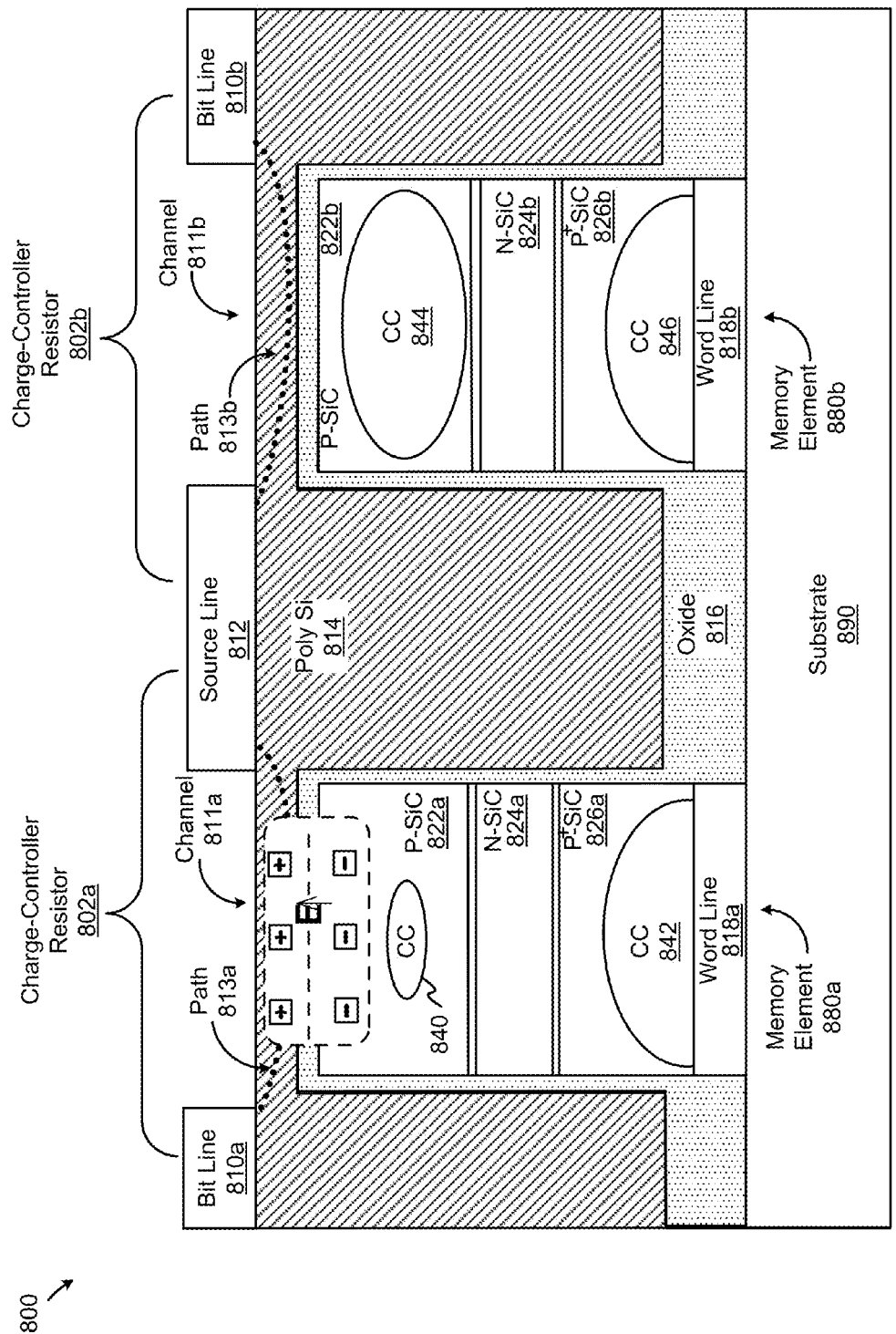
FIG. 8 depicts an example of a memory cell including multiple charge-controlled resistors, according to some embodiments of the invention.

FIG. 8 depicts an example of a memory cell including multiple charge-controlled resistors, according to some embodiments of the invention. In the example shown, memory cell 800 includes a charge-controlled resistor 802a and another charge-controlled resistor 802b. Charge-controlled resistor 802a is formed between a bit line 810a and a source line 812, and charge-controlled resistor 802b is formed between source line 812 and a bit line 810b. Charge-controlled resistor 802a includes a memory element 880a disposed on a substrate 890, and a channel 811a of polysilicon 814 as a resistive element. Charge-controlled resistor 802b includes a memory element 880b disposed on substrate 890, and a channel 811b of polysilicon 814 as another resistive element. Memory element 880a includes a portion of an oxide 816 and a PNP diode structure including a p-type silicon carbide structure ("P-SiC") 822a having a charge cloud ("CC") 840, an n-type silicon carbide structure ("N-SiC") 824a, and a p-type silicon carbide structure ("P+-SiC") 826a having a charge cloud ("CC") 842 and a word line 818a formed as a part of p-type silicon carbide structure 826a. Similarly, memory element 880b includes a portion of oxide 816 and a PNP diode structure including a p-type silicon carbide structure ("P-SiC") 822b having a charge cloud ("CC") 844, an n-type silicon carbide structure ("N-SiC") 824b, and a p-type silicon carbide structure ("P+-SiC") 826b having a charge cloud ("CC") 846 and a word line 818b formed as a part of p-type silicon carbide structure 826b. As charge cloud ("CC") 844 is relatively large, charge-controlled resistor 802b is in an equilibrium state, and, therefore, conductive path 813b has a relatively low resistance, whereas conductive path 813a has a relatively high resistance as charge cloud 840 is relatively small and charge-controlled resistor 802b is a non-equilibrium state.

Figure 9:
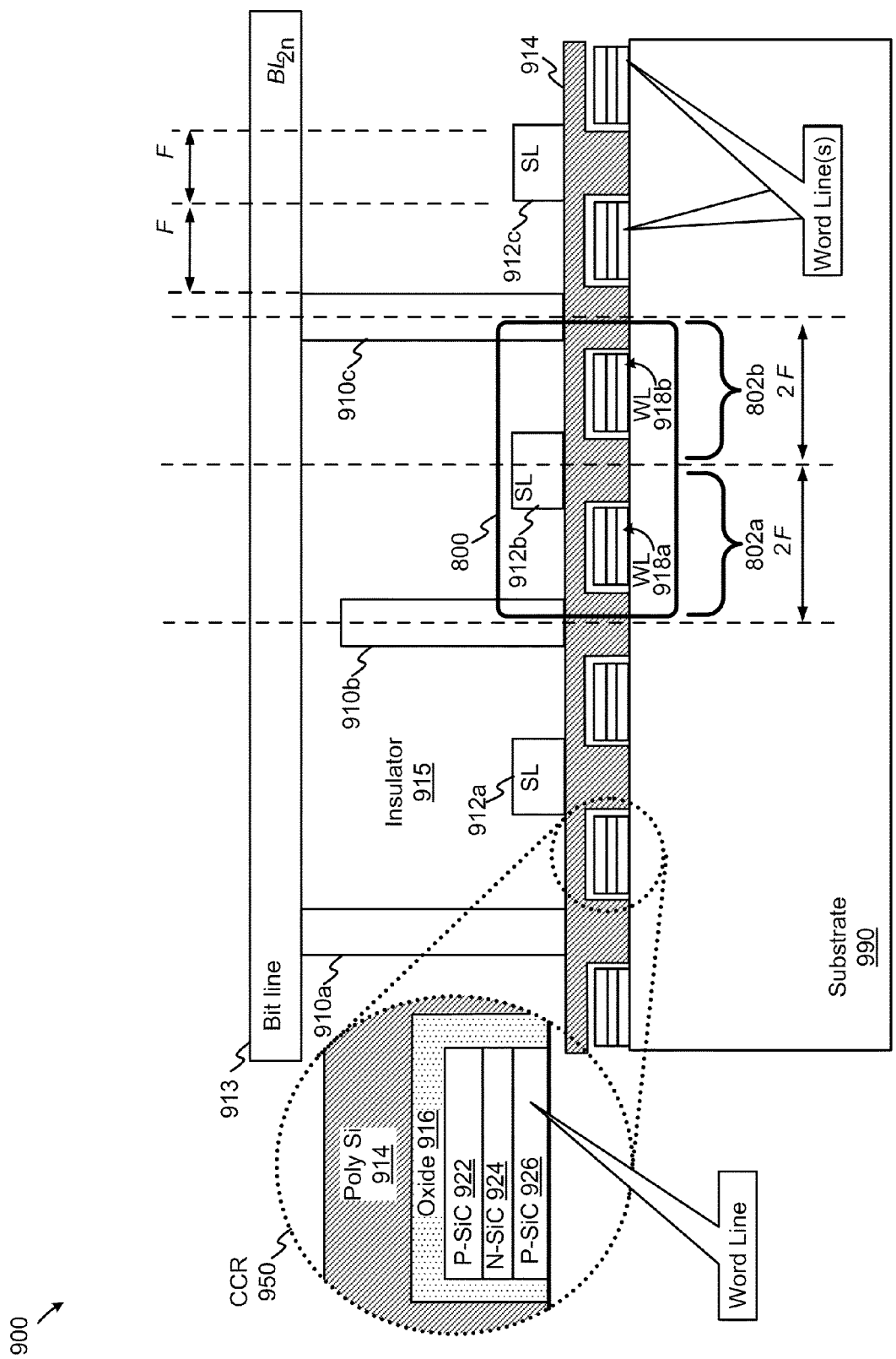
FIG. 9 depicts an example of a portion of a memory array that includes the memory cell of FIG. 8, according to some embodiments of the invention.

FIG. 9 depicts an example of a portion of a memory array that includes the memory cell of FIG. 8, according to some embodiments of the invention. Array portion 900 includes charge-controlled resistors 950 disposed on a substrate 990. Array portion 900 also includes memory cell 800 that includes charge-controlled resistors 802a and 802b of FIG. 8, which includes word lines 918a and 918b, respectively. Memory cell 800 is coupled to source line ("SL") 912b and to bit lines contacts 910b and 910c. Bit line contact 910b is coupled to an odd bit line (e.g., 2n−1), and is not shown, whereas bit line contact 910c is coupled to an even bit line (e.g., 2n) 913, which is formed on an insulator 915. Another bit line contact 910a is also coupled to bit line 913. Other source lines 9112a and 912c are formed on top of polysilicon 914. Charge-controlled resistors 950 include a portion of polysilicon 914, an oxide 916, and a PNP diode structure including a p-type silicon carbide structure ("P-SiC") 922, an n-type silicon carbide structure ("N-SiC") 924, and a p-type silicon carbide structure ("P-SiC") 926.

Figure 10:
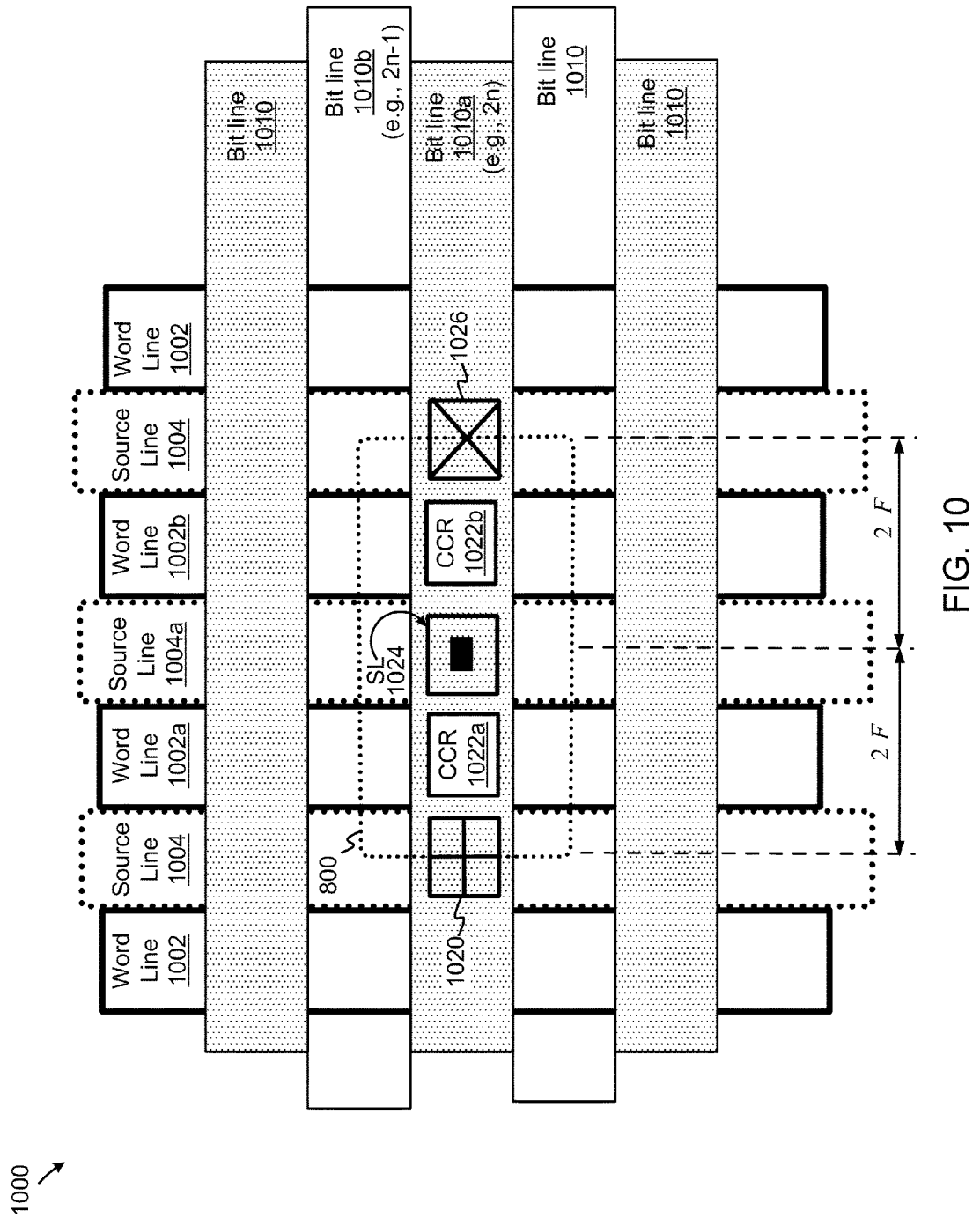
FIG. 10 is a top view depicting an example for a portion of a memory array that includes the memory cell of FIG. 8, according to some embodiments of the invention.

FIG. 10 is a top view depicting an example of a portion of a memory array that includes the memory cell of FIG. 8, according to some embodiments of the invention. Memory cell 800 includes a source line contact ("SL") 1024 coupled to source line 1004a. Source line contact 1024 corresponds to source line ("SL") 912b of FIG. 9. Contacts 1022a and 1022b for respective charge-controlled resistors ("CCR") 802a and 802b are coupled to word lines 1002a and 1002b, respectively. A contact 1026 couples bit line 1010a to bit line contact 910c of FIG. 9, whereas a contact 1020 couples bit line 1010b to bit line contact 910b of FIG. 9. As is observed in FIGS. 9 and 10, memory cell 800 corresponds to a cell area of $4F^2$, according to some embodiments.

Figure 11A:
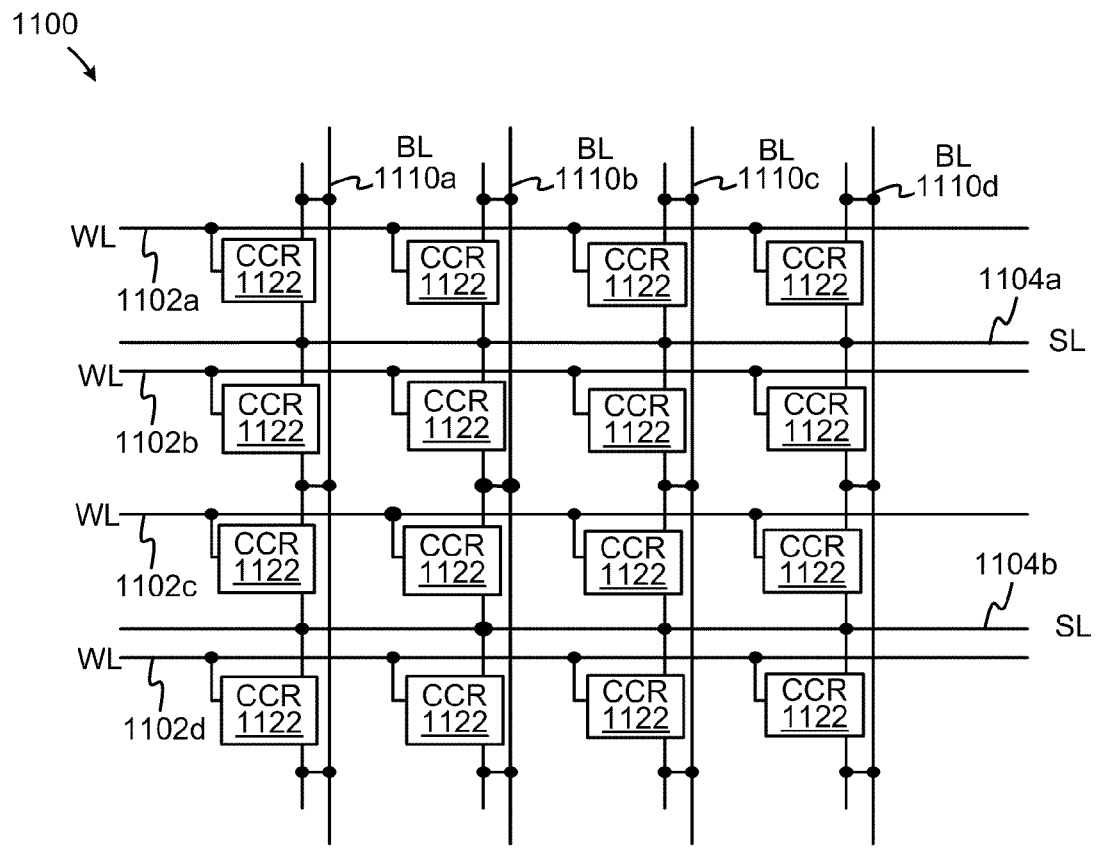
FIG. 11A is a schematic diagram of a portion of an array including charge-controlled resistors, according to some embodiments.
Figure 11B:
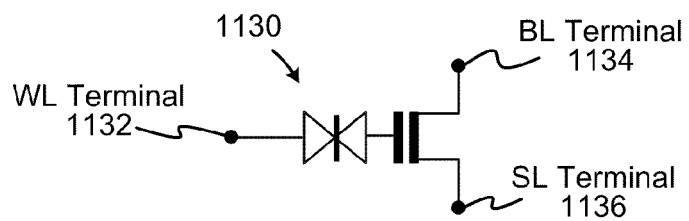
FIGS. 11B and 11C depict schematic representations of a charge-controlled resistor, according to some embodiments.
Figure 11C:
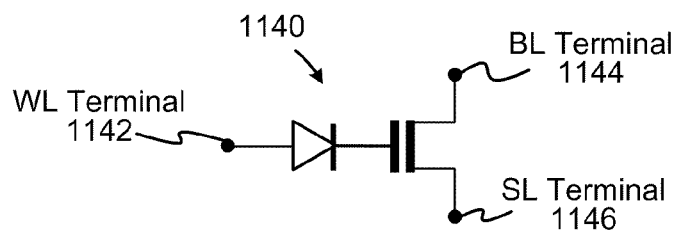

FIG. 11A is a schematic diagram for a portion of an array including charge-controlled resistors, according to some embodiments. Array portion 1100 is a NOR-type array and includes a number of word lines ("WL") 1102a to 1102d, a number of bit lines ("BL") 1110a to 1110d, and a number of source lines ("SL") 1004a and 1004b. Charge-controlled resistors 1122 are disposed at the intersections of a word line 1102, a bit line 1110 and a source line 1004. FIG. 11B depicts a schematic representation of a charge-controlled resistor 1130 having a word line ("WL") terminal 1132, a bit line ("BL") terminal 1134, and a source line terminal 1136, whereas FIG. 11C depicts another schematic representation of a charged-controlled resistor 1140 including a word line ("WL") terminal 1142, a bit line ("BL") terminal 1144 and a source line terminal 1146.

Figure 12:
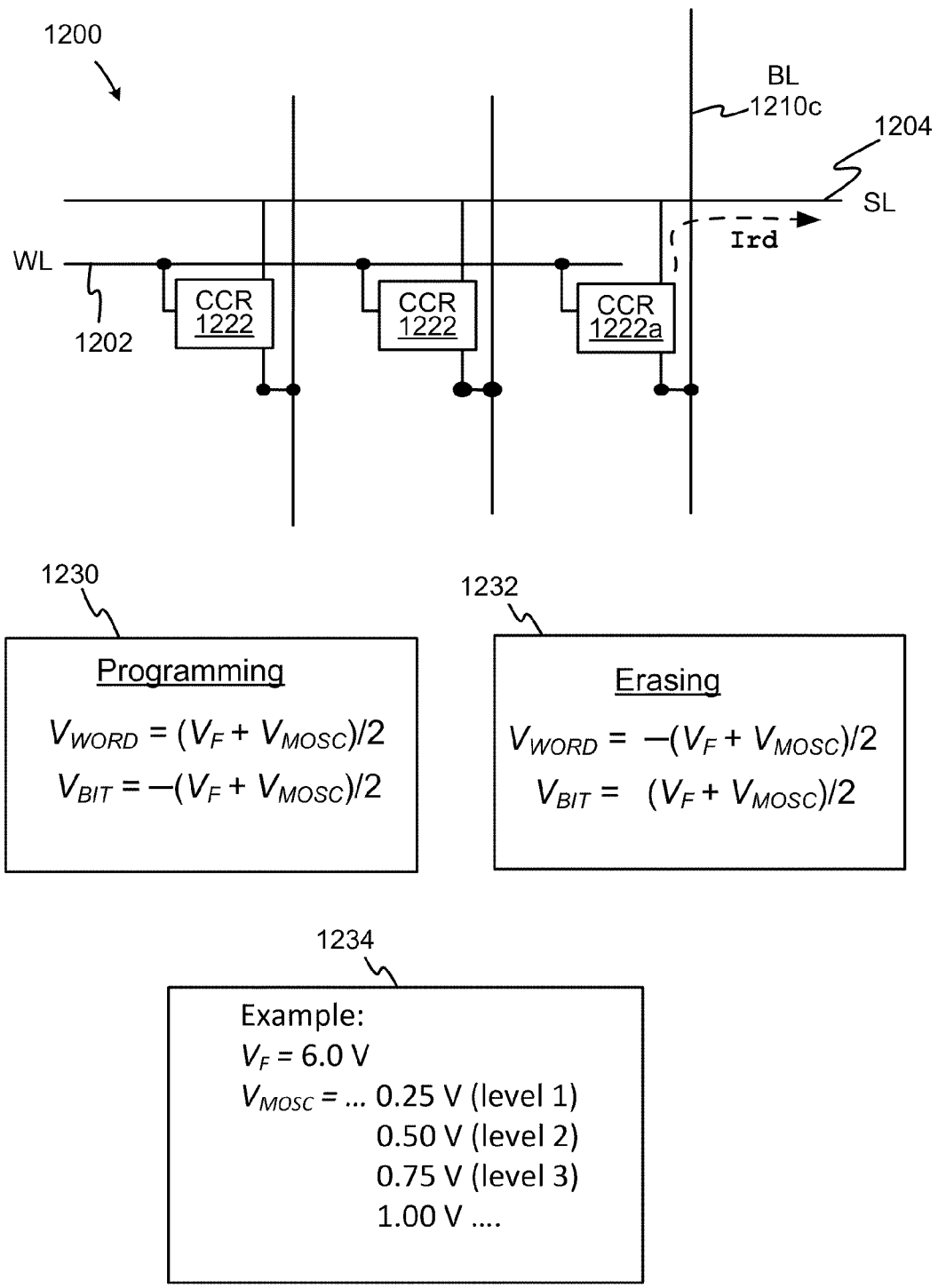
FIG. 12 is a diagram of configurations for programming and erasing charge-controlled resistors, according to various embodiments.

FIG. 12 is a diagram of configurations for programming and erasing charge-controlled resistors, according to various embodiments. To program charged-controlled resistor 1122a, programming voltages can be applied as described in programming legend 1230, whereas charged-controlled resistor ("CCR") 1122a can be erased by applying erasing voltages in programming legend 1232. The programming and erasing voltages are supplied to charged-controlled resistor 1122a via word line ("WL") 1202 and bit line ("BL") 1210c. An example of a voltage, $V_F$, is shown in programming legend 1234.

The various embodiments of the invention can be implemented in numerous ways, including as a system, a process, an apparatus, or a series of program instructions on a computer readable medium such as a computer readable storage medium or a computer network where the program instructions are sent over optical or electronic communication links. In general, the steps of disclosed processes can be performed in an arbitrary order, unless otherwise provided in the claims.

The foregoing description, for purposes of explanation, uses specific nomenclature to provide a thorough understanding of the invention. However, it will be apparent to one skilled in the art that specific details are not required in order to practice the invention. In fact, this description should not be read to limit any feature or aspect of the present invention to any embodiment; rather features and aspects of one embodiment can readily be interchanged with other embodiments. Notably, not every benefit described herein need be realized by each embodiment of the present invention; rather any specific embodiment can provide one or more of the advantages discussed above. In the claims, elements and/or operations do not imply any particular order of operation, unless explicitly stated in the claims. It is intended that the following claims and their equivalents define the scope of the invention.

The invention claimed is:

1. A memory cell comprising:
   a silicon carbide structure including:
      a charge reservoir configured to store an amount of charge carriers constituting a charge cloud, the amount of charge carriers representing a data value, and
      a barrier configured to substantially prevent charge carrier transport in association with the charge reservoir to maintain the data value in a first mode of operation; and
   a resistive element in communication with the charge reservoir and configured to provide a resistance as a function of the amount of charge carriers in the charge reservoir.

2. The memory cell of claim 1 further comprising
   a first terminal; and
   a second terminal,
   wherein the first terminal and the second terminal are configured to receive a voltage to generate a potential difference across the silicon carbide structure to modulate the size of the charge cloud in a second mode of operation.

3. The memory cell of claim 2 wherein the charge cloud is configured to have a first size responsive to a first voltage applied to the first terminal and the second terminal, and is further configured to have a second size responsive to a second voltage applied to the first terminal and the second terminal, the first size being greater than the second size.

4. The memory cell of claim 3 wherein the first size of the charge cloud indicates a first data value and the second size of the charge cloud indicates a second data value.

5. The memory cell of claim 1 wherein the charge cloud is configured to have a first size indicative of a first amount of charge carriers and to have a second size indicative of a second amount of charge carriers.

6. The memory cell of claim 5 wherein the charge reservoir is configured to provide an amount of immobile charge ions when the charge cloud is at the second size, the amount of immobile charge ions being configured to facilitate generation of an electric field in cooperation with the resistive element.

7. The memory cell of claim 6 wherein the amount of immobile charge ions facilitates the configuration of the resistive element to operate in a first resistive state.

8. The memory cell of claim 5 wherein the charge reservoir is configured to provide another amount of immobile charge ions when the charge cloud is at the first size to facilitate the configuration of the resistive element to operate in a second resistive state.

9. The memory cell of claim 1 further comprising:
   a third terminal; and
   a fourth terminal coupled to the third terminal via the resistive element,
   wherein the resistive element comprises a homogenous semiconductor material.

10. The memory cell of claim 9 wherein the homogenous semiconductor material comprises:
    a layer of polysilicon excluding doped source and drain regions.

11. The memory cell of claim 9 wherein the third terminal and the first terminal constitute a common terminal, wherein the common terminal is a bit line terminal, the second terminal is a word line terminal, and the fourth terminal is a source line terminal.

12. The memory cell of claim 1 wherein the charge reservoir is configured to provide an amount of immobile charge ions when the charge cloud is at a second size, the amount of immobile charge carriers being configured to induce an electric field in cooperation with the resistive element, thereby configuring the resistive element to operate in an increased resistance state.

13. The memory cell of claim 1 wherein the charge reservoir further comprises:
a p-type semiconductor material.
14. The memory cell of claim 1 wherein the silicon carbide structure is a PNP diode.
15. The memory cell of claim 1 wherein barrier comprises:
a P-N junction in between a p-type silicon carbide material and an n-type silicon carbide material.
16. The memory cell of claim 15 further comprising:
a first terminal; and
a second terminal,
wherein the first terminal and the second terminal are configured to apply a potential difference across the P-N junction to modulate the size of the charge cloud.
17. The memory cell of claim 1 wherein the barrier is configured to modulate the size of the charge cloud to change the data value.
18. A memory cell comprising:
a charge-controlled resistor ("CCR") including:
a first doped portion of a silicon carbide structure configured to include a charge cloud;
a second doped portion of the silicon carbide structure formed adjacent to the first doped portion of the silicon carbide structure to establish a barrier for charge carriers;
a dielectric material coupled to at least the first doped portion of the silicon carbide structure; and
a resistive element formed adjacent to the dielectric material,
wherein the size of the charge cloud is configured to establish a degree of resistance of the resistive element.
19. The memory cell of claim 18 wherein the charge-controlled resistor ("CCR") further comprises a third doped portion of the silicon carbide structure of a PNP silicon carbide diode, wherein the first and the third doped portions include p-type silicon carbide and the second doped portion includes n-type silicon carbide.
20. The memory cell of claim 19 wherein the dielectric material is a silicon dioxide layer formed on the top and at least two sides of the first doped portion, and at least two sides of the second doped portion and the third doped portion.
21. The memory cell of claim 18 further comprising:
a bit line terminal; and
a word line terminal,
wherein the bit line terminal and the word line terminal are configured to receive a voltage to generate a potential difference across the charge-controlled resistor to modulate the size of the charge cloud.
22. The memory cell of claim 21 wherein the charge cloud is configured to form a reduced charge cloud size under a positive potential difference across the charge-controlled resistor from the bit line terminal to the word line terminal, the reduced charge cloud size being configured to generate an amount of negative acceptors in the first doped portion of the silicon carbide structure.
23. The memory cell of claim 22 wherein the amount of negative acceptors in the first doped portion of the silicon carbide structure establishes a first depletion region in the first doped portion and a second depletion region of positive donors in the resistive element.
24. The memory cell of claim 21 wherein the charge cloud is configured to form an increased charge cloud size under a negative potential difference across the charge-controlled resistor from the bit line terminal to the word line terminal, the increased charge cloud size being configured to neutralize the amount of negative acceptors in the first doped portion of the silicon carbide structure.
25. The memory cell of claim 24 wherein the increased charge cloud size provides for a low resistance state for the resistive element.
26. The memory cell of claim 21 wherein the charge-controlled resistor is configured to operate in read mode when the potential difference is absent.
27. The memory cell of claim 18 wherein the barrier is coincident with a P-N junction.
28. The memory cell of claim 18 wherein the resistive element is homogenously-doped polysilicon.
29. The memory cell of claim 18 further comprising another charge-controlled resistor ("CCR").
30. A memory array comprising:
a plurality of memory cells including charge-controlled resistors ("CCRs") in a plane, each charge-controlled resistor including a silicon carbide-based PNP diode formed on a silicon substrate;
a plurality of charge clouds in the charge-controlled resistors;
a plurality of word lines formed in between the plane and the silicon substrate in which a word line is a p-type silicon carbide portion of the silicon carbide-based PNP diode;
a plurality of bit lines formed in another plane and configured to couple to first terminals of the charge-controlled resistors; and
a plurality of source lines formed in yet another plane and configured to couple to second terminals of the charge-controlled resistor,
wherein potential differences applied to the plurality of bit lines and the plurality of source lines modify amounts of charge carriers for the plurality of charge clouds.

* * * * *